(12) United States Patent
Park et al.

(10) Patent No.: US 9,577,640 B1
(45) Date of Patent: Feb. 21, 2017

(54) FLEXIBLE, SPACE-EFFICIENT I/O CIRCUITRY FOR INTEGRATED CIRCUITS

(71) Applicant: Baysand Inc., Morgan Hill, CA (US)

(72) Inventors: Jonathan C Park, San Jose, CA (US); Yin Hao Liew, Penang (MY); Kok Seong Lee, Penang (MY); Salah M Werfelli, Morgan Hill, CA (US)

(73) Assignee: Baysand Inc., Morgan Hill, CA (US)

( * ) Notice: Subject to any disclaimer, the term of this patent is extended or adjusted under 35 U.S.C. 154(b) by 0 days.

(21) Appl. No.: 14/293,401

(22) Filed: Jun. 2, 2014

Related U.S. Application Data

(63) Continuation-in-part of application No. 13/627,624, filed on Sep. 26, 2012, now Pat. No. 9,166,594.

(60) Provisional application No. 61/652,320, filed on May 28, 2012.

(51) Int. Cl.
| | |
|---|---|
| *H03K 19/173* | (2006.01) |
| *H01L 25/00* | (2006.01) |
| *H01L 23/50* | (2006.01) |
| *H01L 23/522* | (2006.01) |
| *H01L 27/02* | (2006.01) |
| *H01L 23/00* | (2006.01) |

(52) U.S. Cl.
CPC ........... *H03K 19/1736* (2013.01); *H01L 23/50* (2013.01); *H01L 23/5226* (2013.01); *H01L 24/06* (2013.01); *H01L 27/0296* (2013.01); *H01L 2924/1431* (2013.01)

(58) Field of Classification Search
None
See application file for complete search history.

(56) References Cited

U.S. PATENT DOCUMENTS

| | | | | |
|---|---|---|---|---|
| 2005/0257177 | A1* | 11/2005 | Chen ................... | G06F 17/5045 716/106 |
| 2006/0022705 | A1* | 2/2006 | Or-Bach ............ | G01R 31/3172 326/41 |
| 2006/0279326 | A1* | 12/2006 | Savage ............... | G06F 17/5077 326/38 |
| 2011/0260318 | A1* | 10/2011 | Eisenstadt ........... | G06F 17/5054 257/737 |

* cited by examiner

*Primary Examiner* — Anh Tran
(74) *Attorney, Agent, or Firm* — Useful Arts IP

(57) ABSTRACT

Flexible, space-efficient I/O architectures for integrated circuits simplify circuit design and shorten design times. In one aspect, cells for power supply pads are eliminated, in part by locating ESD circuitry for these pads underneath the pads themselves, leaving only signal I/O buffers. Pads coupled to the signal I/O buffers may be defined as either signal I/O pads or power supply pads in accordance with customization circuitry. Customization circuitry also provides for flexible bank architectures, where signal I/O buffers within a bank share power supply requirements that may be different from another bank. The number of banks and the number of signal I/O buffers belonging to each bank is flexibly defined. In other aspects, ESD circuitry is provided at corners of the IC layout and optionally within selected I/O slots. Decap circuitry is provided at an outer edge of the IC layout and is scalable in order to meet different requirements.

21 Claims, 20 Drawing Sheets

_US 9,577,640 B1_

FLEXIBLE, SPACE-EFFICIENT I/O CIRCUITRY FOR INTEGRATED CIRCUITS

BACKGROUND

Field of the Invention

The present invention relates to I/O circuitry for integrated circuits.

State of the Art

Complex integrated circuits are often I/O-limited, meaning that the die size is increased beyond what would otherwise be required in order to accommodate the required number of I/Os. For integrated circuits generally, and especially I/O-limited integrated circuits, design of the I/O portion of the integrated circuit is often laborious and time-consuming. At the same time, short product design cycles call for short integrated circuit design cycles. Reducing design time and labor for integrated circuits, including complex, I/O limited integrated circuits, requires new approaches.

FIG. 1 shows a top view of the layout of a portion 300 of I/O circuitry of an example IC die, according to the prior art. I/O circuitry 300 could run along any edge of the periphery of an IC die. The I/O circuitry 300 uses two concentric rows of bond pads, i.e., inner pad row 1 and outer pad row 2. The pad placements along the peripheral edge are offset between the two rows. During the wire bonding process, all pads along the outer row 2 are typically wire bonded before any bond pads on inner row 1 are wire bonded (or vice versa). This arrangement enables I/O pads to be packed more densely without exceeding the capabilities (minimum pad pitch) of wire bonding equipment.

Bond pads in FIG. 1 include signal bond pads (SIG) 201 and power/ground bond pads. Power/ground bond pads in turn include power bond pads (VCC CORE) 204 for a core logic portion of the integrated circuit, ground bond pads (VSS CORE) 205 for the core logic portion of the integrated circuit, power bond pads (VCC I/O) 202 for the I/O portion of the integrated circuit, and ground bond pads (VSS I/O) 203 for the I/O portion of the integrated circuit. Each of the foregoing pads is coupled to a corresponding one of I/O cells 130, including differentiated signal I/O cells (SIG I/O) 211, core logic power I/O cells (VCC CORE) 214, core logic ground cells (VSS CORE) 215, I/O power cells (VCC I/O) 212, and I/O ground cells (VSS I/O) 213. A primary function of the four power/ground cells 130 is to provide electrostatic discharge (ESD) protection to the associated power/ground pads and supply power and ground to a group of I/O cells (SIG I/O) 211.

Each of the cells 130 occupies an I/O slot, the I/O slots being spaced apart according to a specified pitch. For a complex integrated circuit, roughly 30% of the I/O pads will typically be power/ground pads, and a corresponding proportion of the cells 130 will be power/ground cells.

BRIEF DESCRIPTION OF THE DRAWING FIGURES

The present invention may be further understood from the following Detailed Description in conjunction with the appended drawing figures. In the drawing.

DETAILED DESCRIPTION

Summary

Flexible, space-efficient I/O architectures for integrated circuits simplify circuit design and shorten design times. In one aspect, cells for power supply pads are eliminated, in part by locating ESD circuitry for these pads underneath the pads themselves, leaving only signal I/O buffers. Pads coupled to the signal I/O buffers may be defined as either signal I/O pads or power supply pads in accordance with customization circuitry. Customization circuitry also provides for flexible bank architectures, where signal I/O buffers within a bank share power supply requirements that may be different from power supply requirements of signal I/O buffers of another bank. The number of banks and the number of signal I/O buffers belonging to each bank is flexibly defined. In other aspects, ESD circuitry is provided at corners of the IC layout and optionally within selected I/O slots. Decap circuitry is provided at an outer edge of the IC layout and is scalable in terms of width in order to meet different signal integrity requirements for different SoC or ASIC design.

Customization circuitry also provides for flexible pad options, whereby the IC pads may be configured, for example, for wire bonding, for flip-chip bonding, or for other types of bonding.

Description

Flexible, Space-Efficient Layout

Figure 1:
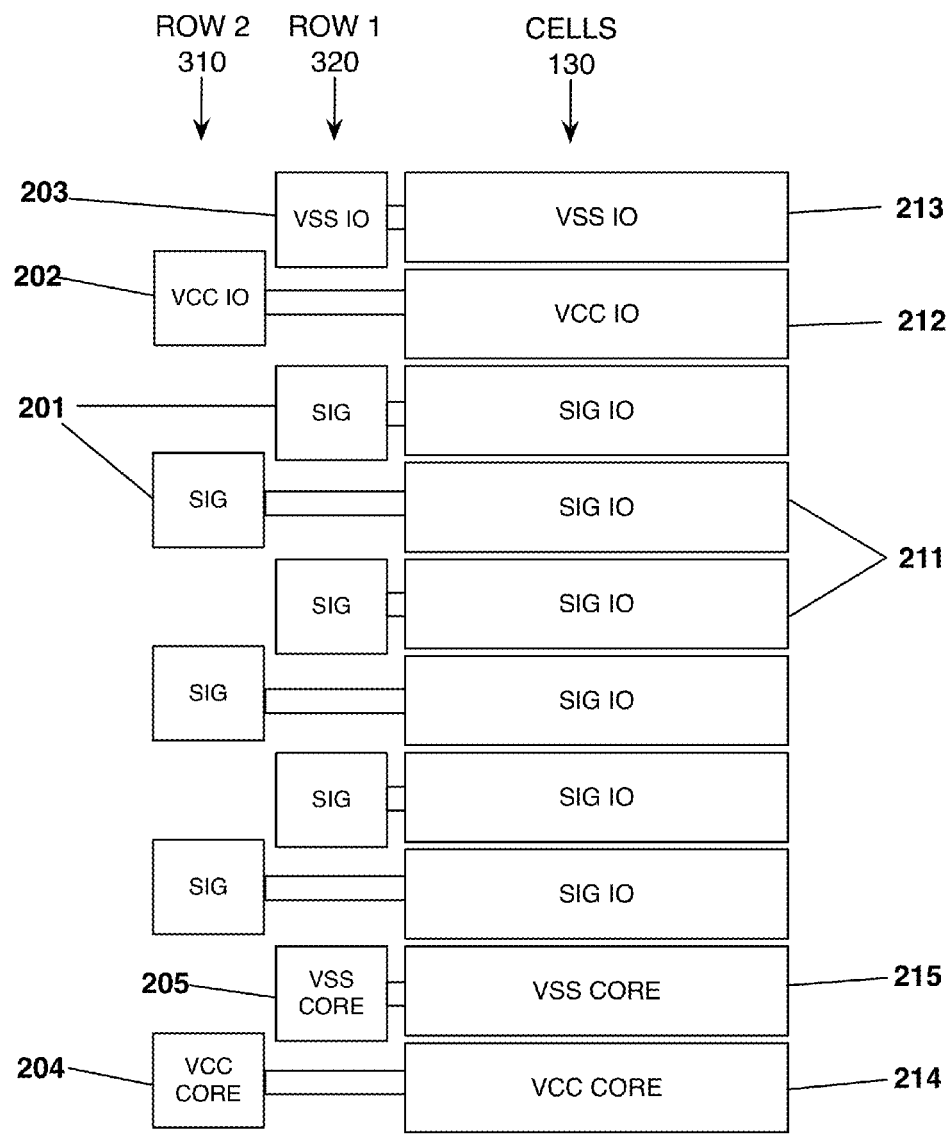
FIG. 1 is a diagram of a portion of known I/O circuitry of an integrated circuit.

One aspect of the present flexible, space-efficient I/O circuitry involves the elimination of the power/ground cells of FIG. 1.

Figure 2:
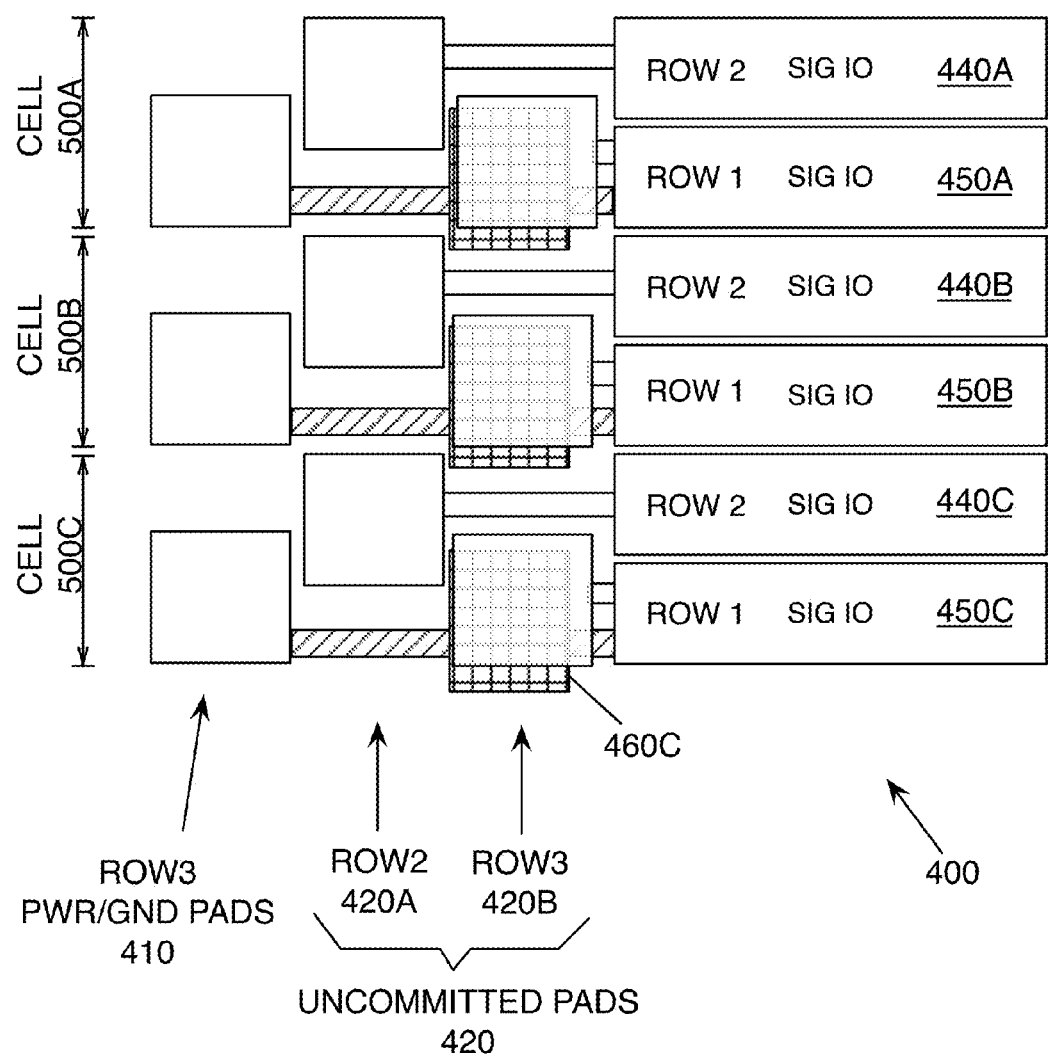
FIG. 2 is a diagram of a portion of flexible, space-efficient I/O circuitry of an integrated circuit.

Referring to FIG. 2, a diagram is shown of a top view of the layout of a portion 400 of I/O circuitry of an IC. I/O circuitry 400 includes an outer row 410 (i.e., row 3) of three power/ground pads. I/O circuitry 400 also includes a middle row 420A (i.e., row 2) of three uncommitted pads, and an inner row 420B (i.e., row 1) of three uncommitted pads. Many of uncommitted pads 420 will be mask programmed (i.e., programmed, committed, configured, or personalized) so as to handle I/O signals. Some may be unused, and some may be used for a power/ground line. I/O circuitry 400 also includes three electrostatic discharge (ESD) protection circuits, e.g., ESD protection circuit 460C, one of which may be electrically connected with each of the three power/ground pads 410.

I/O circuitry 400 also includes six signal (SIG) I/O cells, or I/O buffers. These include three ROW 1 SIG I/O cells 450A, 450B and 450C that may be electrically connected to the three uncommitted pads 420B on row 1. The SIG I/O cells also include three ROW 2 SIG I/O cells 440A, 440B and 440C that may be electrically connected to the three uncommitted pads 420A on row 2. Thus, each uncommitted pad 420 is electrically connected with either a cell 440 or a cell 450. I/O circuitry 400 positions bond pads in a staggered, three-row scheme. The pad positions align, along the peripheral edge of the die, between inner row 1 and outer row 3. The pad positions may be staggered (i.e., offset) between middle row 2 and the pads of both row 1 and row 3.

Each of the three power/ground pads 410 may be electrically connected with a corresponding instance of ESD protection circuits 460. Each ESD protection circuit 460 is positioned substantially underneath one or more of the uncommitted pads 420. In this manner, the I/O circuitry 400 advantageously eliminates the need for any power/ground periphery cells. Thus, the I/O circuitry 400 advantageously reduces the required I/O die area for pad limited ICs.

The function of each of the six SIG I/O cells 440 or 450 may be determined by means of mask programming. Each cell's function can be determined independently of the function of any other SIG I/O cell. In the case of a mask programmable IC, an initial portion of the wafer fabrication process is controlled via a set of masks called lower masks. A later portion of the wafer fabrication process is controlled by means of a set of masks called late masks. For example, a modern IC might use 30 or 40 different masks at different steps in its wafer fabrication process, whereas only between one and, for example, four or more masks might be needed to customize each specific IC design.

During the late portion of the wafer fabrication process, mask programming determines the functionality of each instance of SIG I/O cell 440 or 450. In one embodiment, the function of each of those cells that is independently selectable by mask programming can be selected from the following set of functions: i) receiving an input signal from the particular uncommitted pad 420 that corresponds to that particular instance of a SIG I/O pad; ii) providing an output signal to a pad 420; iii) both receiving an input signal and providing an output signal to a pad 420; or iv) connecting a pad 420 to one of the power/ground lines within the IC. In various embodiments of the invention, cells like the SIG I/O cells described may have mask programmability of a larger range in its set of functions, or of a smaller range.

Uncommitted pads 420 within I/O circuitry 400 can be mask programmed by means of changing only the late masks. This mask programmability feature advantageously provides highly flexible support for a wide variety of IC designs.

Flexible Pad Assignment

Figure 3:
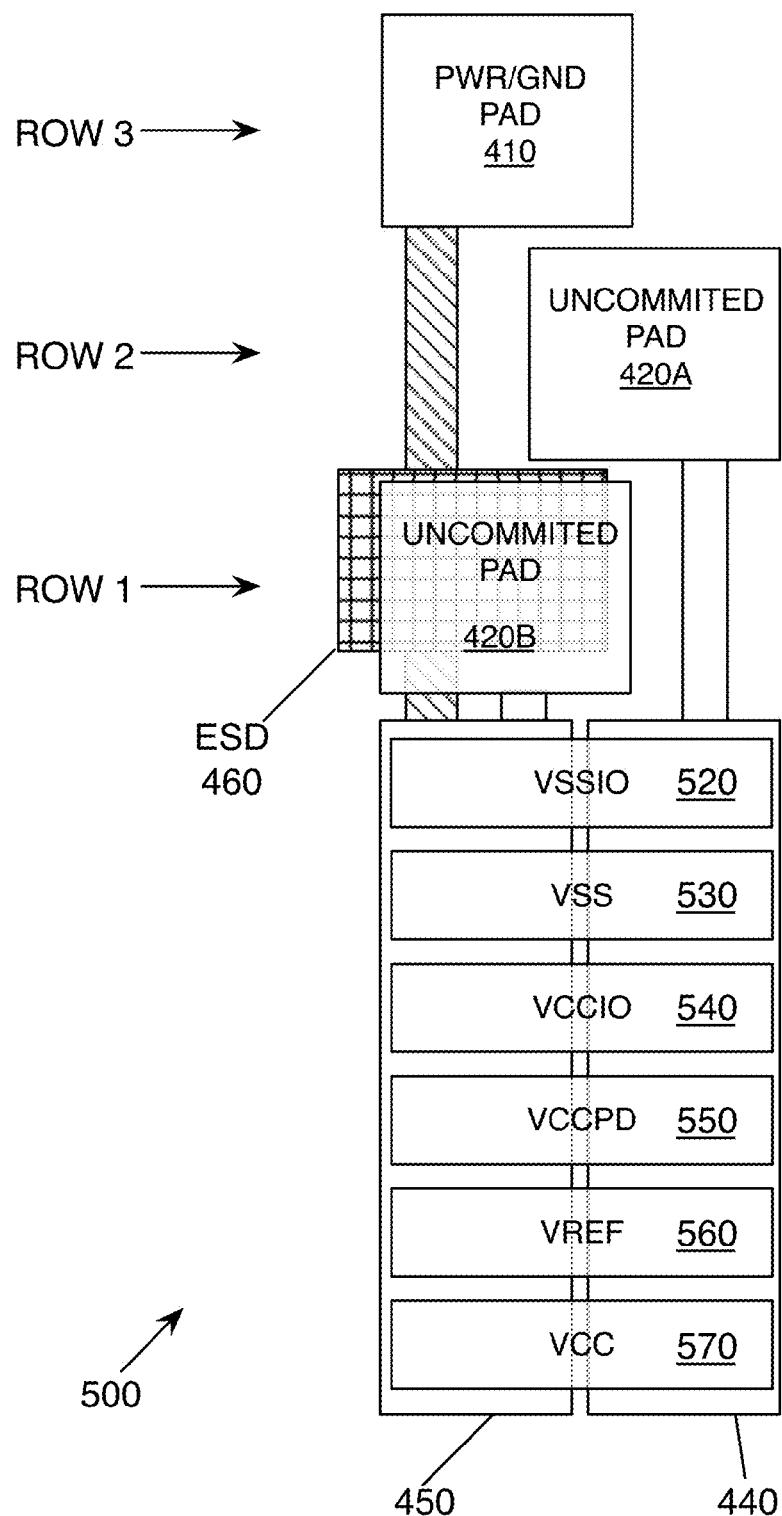
FIG. 3 is a top view of the layout of a single periphery cell of the I/O circuitry of FIG.

In the illustrated embodiment, I/O circuitry 400 is implemented as three instances 500A, 500B and 500C of a periphery cell, each instance of which is identical except for its mask programming. Instances of periphery cell 500 may be the only cells that occur on the peripheral edge of the die. Referring to FIG. 3, a top view is shown of the layout of a single periphery cell 500, according to one embodiment. In the illustrated embodiment, periphery cell 500 includes: one uncommitted pad 420A that is positioned on row 2; one uncommitted pad 420B that is positioned on row 1; one uncommitted power/ground pad 410; one ESD protection circuit 460 may be electrically connected with the uncommitted power/ground pad; one SIG I/O cell 440 may be electrically connected to uncommitted pad 420A; and one SIG I/O cell 450 may be electrically connected to uncommitted pad 420B. Periphery cell 500 also includes a number of power/ground lines that run parallel to the peripheral edge of the die. In the embodiment shown in FIG. 3, these power/ground lines are: VSSIO 520, VSS 530, VCCIO 540, VCCPD 550, VREF 560, and VCC 570. Each of these power/ground lines may be electrically connected uncommitted power/ground pad 410 or uncommitted pad 420A and 420B. The number of power/ground lines supported by the periphery cell may of course vary. Similarly, the functional nature and the nomenclature of those power/ground lines may vary.

Each of the power/ground lines of each particular instance of periphery cell 500 is mask programmable such that the line may extend across and be shared by a variable number of multiple peripheral cells, or may extend only within the confines of a single peripheral cell. In this manner, inter-cell connectivity of each power/ground line can be mask programmed (i.e., programmed, committed, or personalized), by means of changing only the late masks. This mask programmability advantageously provides highly flexible support for a wide variety of IC designs.

Figure 4A:
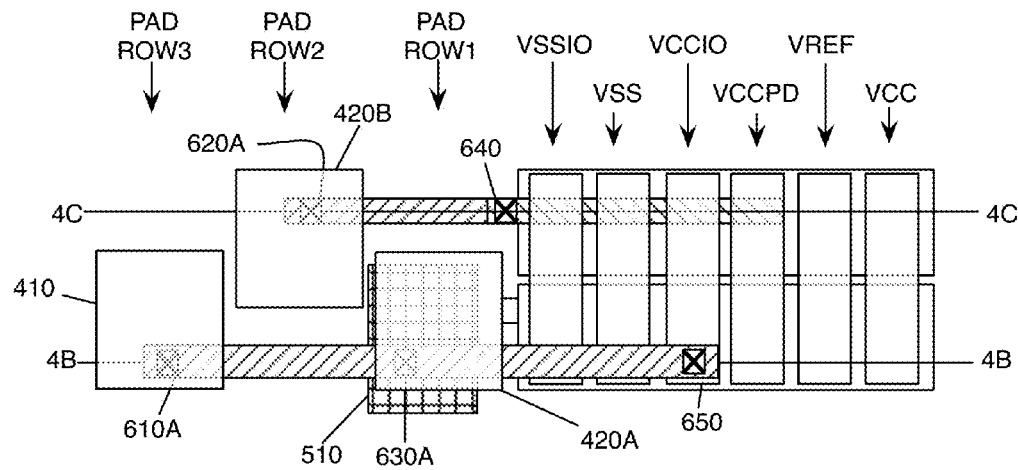
FIG. 4A is a top view of the layout of an instance of the periphery cell of the I/O circuitry of FIG. 2 following mask programming.
Figure 4B:
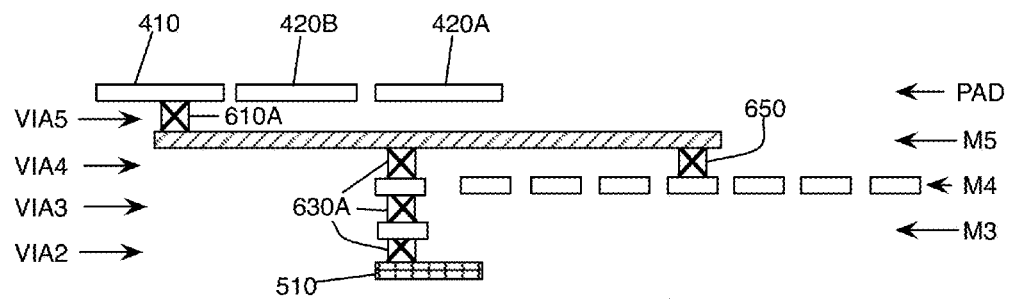
FIG. 4B is a cut-away view of the periphery cell of FIG. 4A.

Referring to FIG. 4A, a top view is shown of the layout of a single periphery cell, according to one embodiment. FIG. 4B is a cutaway side view of the same periphery cell of FIG. 4A, with the cut made on cut line 4B. Similarly, FIG. 4C is a cutaway side view of this same periphery cell, with the cut made on cut line 4C.

FIGS. 4A and 4B show how power/ground pad 410 is mask programmed to electrically connect with the VCCIO power line within the periphery cell shown. This connection passes down through via 610A on via layer VIA5. This connection continues along a metal run on metal layer M5, then down through via 650 to the VCCIO power line on metal layer M4. FIGS. 4A and 4B also show how power/ground pad 410 is mask programmed to connect with ESD protection circuit 510 within this periphery cell which may provide ESD requirement for VCCIO. This electrical connection passes down through three vias 630A, each of which is on one of via layer VIA4, via layer VIA3, or via layer VIA2.

Figure 4C:
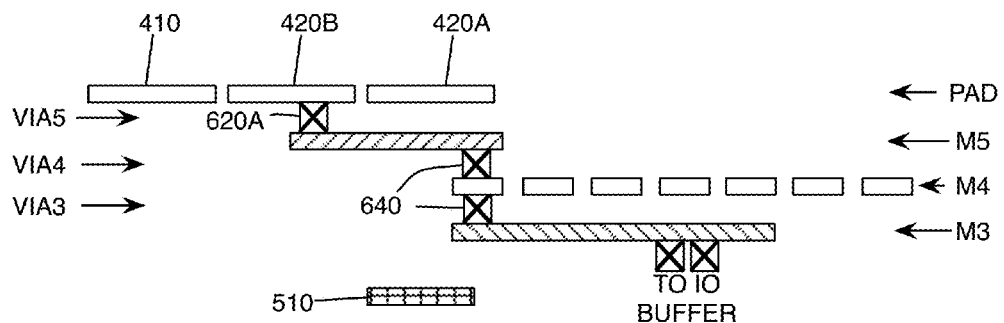
FIG. 4C is another cut-away view of the periphery cell of FIG. 4A.

FIGS. 4A and 4C show how uncommitted pad 420B may be mask programmed to electrically connect with its corresponding I/O buffer within the periphery cell. This connection passes down through via 620A on via layer VIA5, then along a metal run of metal layer M5, then down through vias 640 of via layers VIA4 and VIA5, then along a metal run on metal layer M3, then down through one or more vias into the I/O buffer.

Figure 4D:
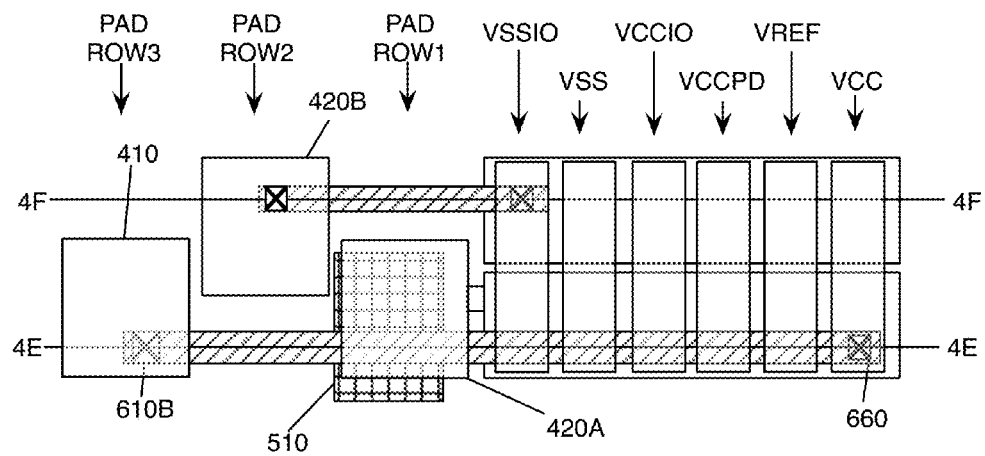
FIG. 4D is a top view of the layout of another instance of the periphery cell of the I/O circuitry of FIG. 2 following mask programming.
Figure 4E:
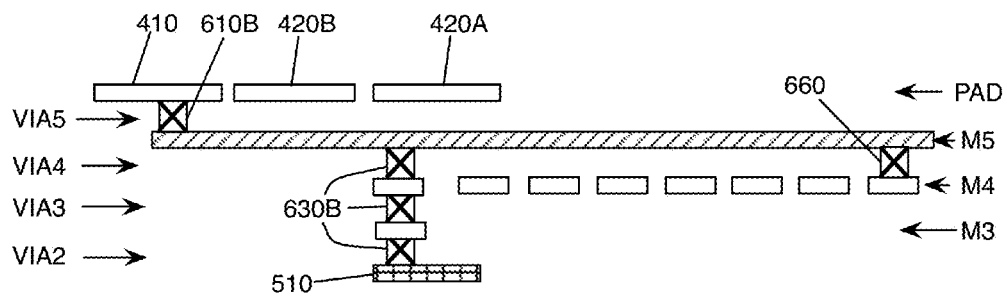
FIG. 4E is a cut-away view of the periphery cell of FIG. 4D.
Figure 4F:
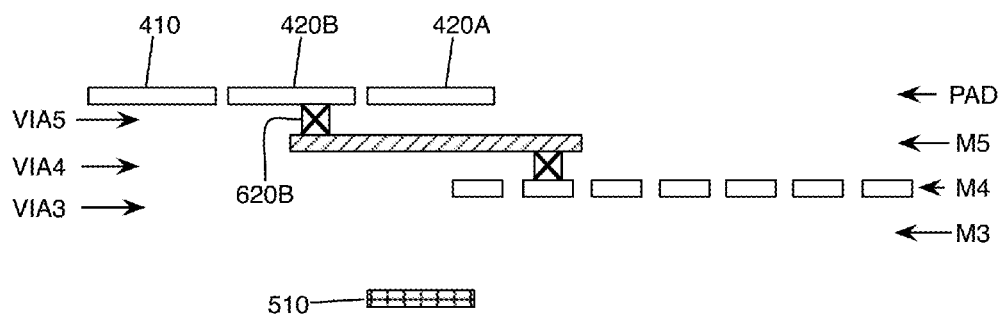
FIG. 4F is another cut-away view of the periphery cell of FIG. 4D.

FIG. 4D-4F show corresponding views of another single periphery cell, according to one embodiment. Note that this periphery cell has different mask programming than that of the cell in FIG. 4A, although these two cells have the same initial masks, and thus the same uncommitted potential functional capabilities.

FIGS. 4D and 4E show how power/ground pad 410 is mask programmed to electrically connect with the VCC power line within this periphery cell (in contrast to the VCCIO power line as shown in FIGS. 4A and 4B). This connection passes down through via 610B of layer VIA5, then along a metal run on metal layer M5, then down through via 660 to the VCC power line on metal layer M4. FIGS. 4D and 4E also show how power/ground pad 410 is mask programmed to electrically connect with ESD protection circuit 510 within this periphery cell which may provide ESD requirement for VCC. This electrical connection passes down through three vias 630B, each of which is on one of via layer VIA4, via layer VIA3, or via layer VIA2.

FIGS. 4D and 4F show how uncommitted pad 420B may be mask programmed to connect with the power line VSSIO within this periphery cell. This electrical connection occurs by means of via 620B of via layer VIA5 and via 670 of via layer VIA4.

Considered together, FIGS. 4A, 4B, 4D, and 4E show how power/ground pad 410 can be mask programmed to connect with either of two specific ones of the power/ground lines within this periphery cell. By means of different mask programming, each power/ground pad in each particular instance of a periphery cell can be programmed to connect with any of the power/ground lines within that periphery cell. Thus, by means of different layouts for the late masks used for the metal and via layers shown in these figures, the I/O bank architecture (i.e., bank architecture or power architecture) can be advantageously and flexibility customized to support the particular functional requirements of the IC.

Similarly, FIGS. 4A, 4C, 4D, and 4F show how uncommitted pad 420B can be mask programmed to connect either with its corresponding I/O buffer or with one of the power or ground lines. By means of different mask programming, any uncommitted pads that are not allocated to an I/O signal can be programmed to connect with any of the metal lines within any periphery cell. Additional pads connecting to a particular power or ground line could improve the performance of the IC by helping to avoid switching induced transient voltages on that line.

Flexible I/O Banks

In a modern IC-based system, one portion of the system may operate at a relatively high voltage and low speed, for example, the data signals that connect the system with removable media or devices. An I/O standard is likely to also specify timing and speed parameters. These can be relevant when designing the I/O bank architecture of ICs that may use that standard; for example, relatively fast signals consume relatively more current which may require a relatively larger ratio of power/ground pads to I/O signal pads within each I/O bank. At the same time and within the same system, another portion of the system may operate at a relatively low voltage and high speed, for example, the data signals that connect an IC with substantial processing capability to an IC with substantial memory capability. As market requirements and manufacturing capabilities evolve, older I/O standards are gradually phased out in favor of newer ones. Thus, some modern IC-based systems may have portions that operate in accordance with relatively recent I/O standards and some that operate in accordance with legacy I/O standards. Thus, there is a need for a wide variety of particular ICs that are easily customizable to handle a potentially wide variety of I/O standards. Examples of such I/O standards might include CMOS, LVCMOS, SSTL, ECL, LVDS, etc.

Figure 5A:
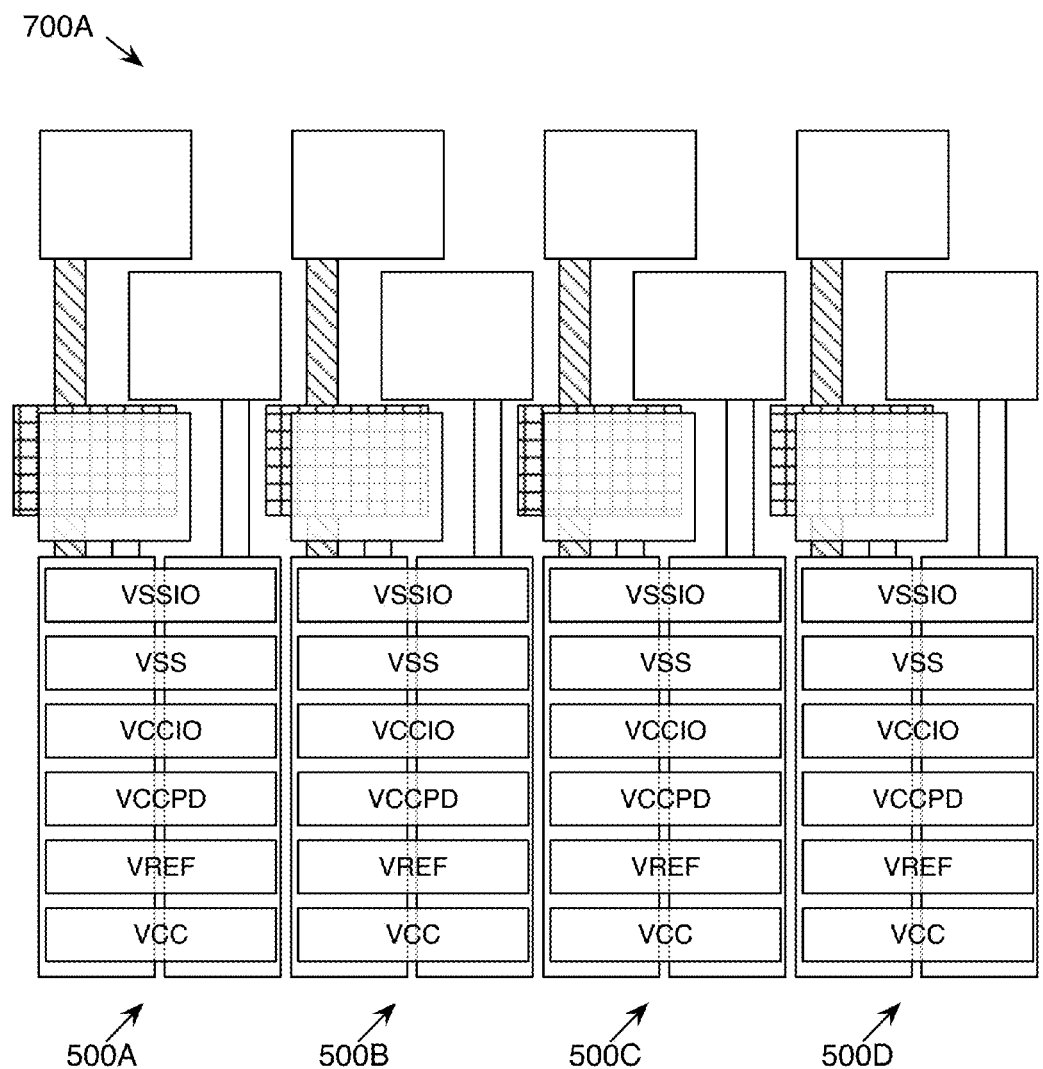
FIG. 5A is a diagram of a group of periphery cells, illustrating pad assignment in accordance with one mask programmed configuration.

Referring to FIG. 5A, a diagram is shown of I/O circuitry 700A, which contains instances 500A, 500B, 500C, and 500D of periphery cell 500. Similarly, FIGS. 5B and 5C, respectively, show I/O circuitry 700B and I/O circuitry 700C, each of which also contains instances 500A, 500B, 500C, and 500D of periphery cell 500. The different I/O circuits 700A, 700B and 700C are differentiated by different mask programming related to the six power ground lines within this cell, specifically the power/ground lines VSSIO, VSS, VCCIO, VCCPD, VREF, and VCC. The number of periphery cells in the I/O circuits 700A, 700B and 700C is exemplary only, and may be greater or less. The number of power/ground lines and their function is also exemplary only.

Figure 5B:
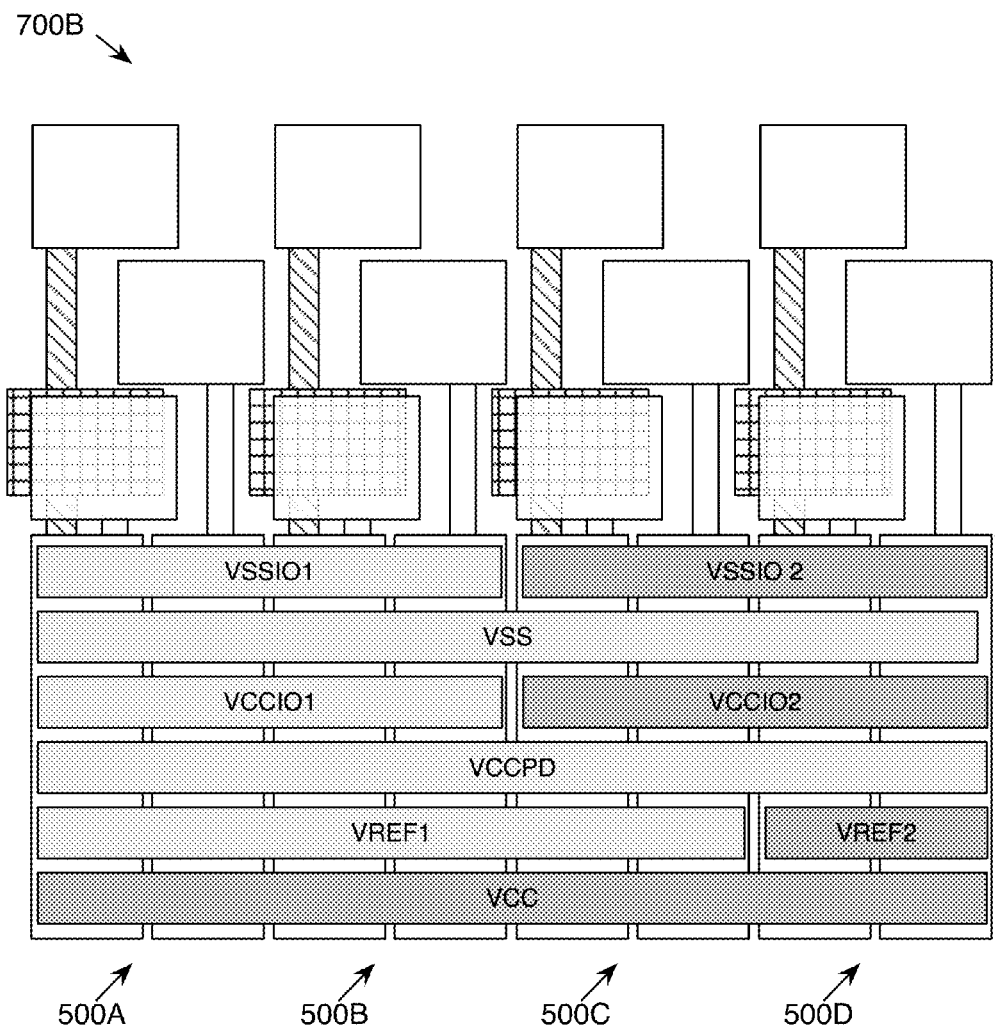
FIG. 5B is a diagram of a group of periphery cells, illustrating pad assignment in accordance with another mask programmed configuration.
Figure 5C:
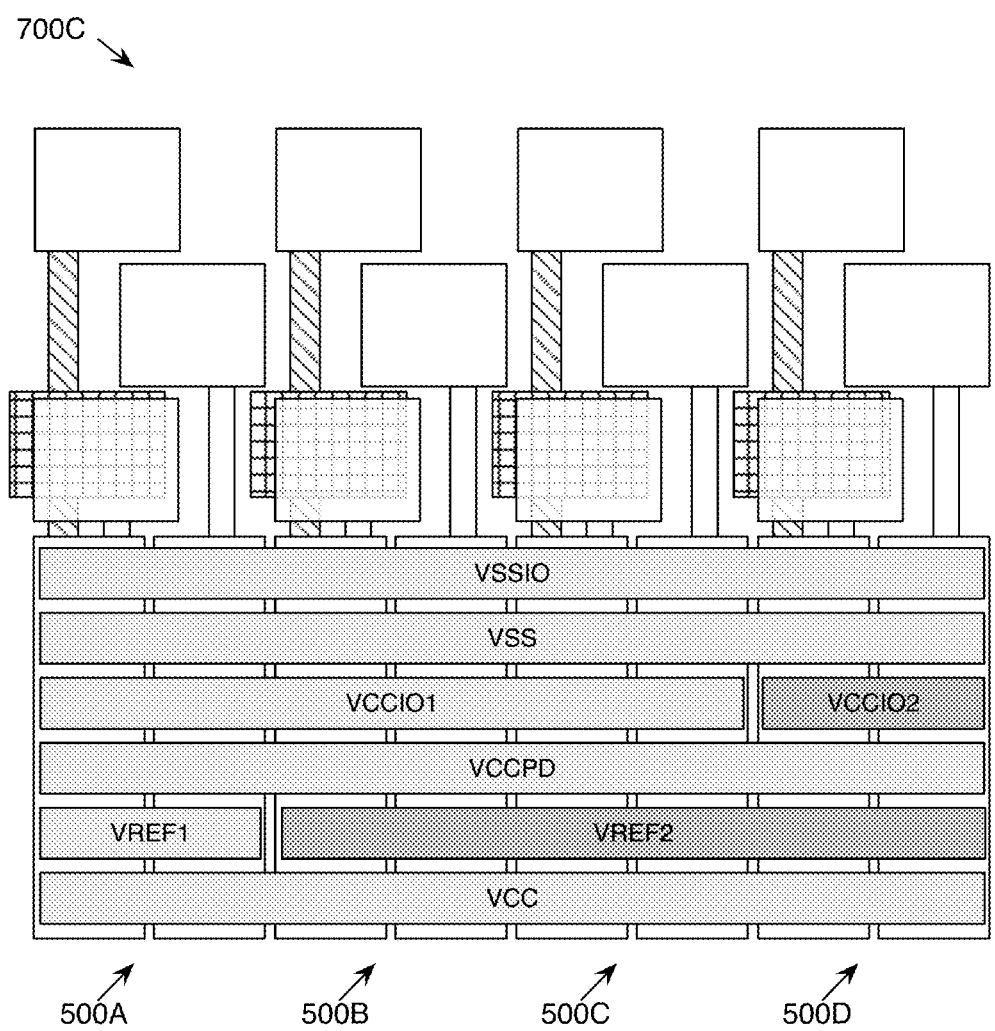
FIG. 5C is a diagram of a group of periphery cells, illustrating pad assignment in accordance with yet another mask programmed configuration.

FIGS. 5A, 5B, and 5C show how the mask programmability of the power/ground lines of periphery cell 500 is used to implement not only multiple I/O banks, but to mix and match reference voltages, such as VREF1 and VREF2, across I/O banks Thus, the mask programmability of the power/ground lines of periphery cells according to embodiments of the invention advantageously supports significant flexibility in the design of a wide variety of I/O bank architectures for a wide variety of specific IC designs.

Figure 6A:
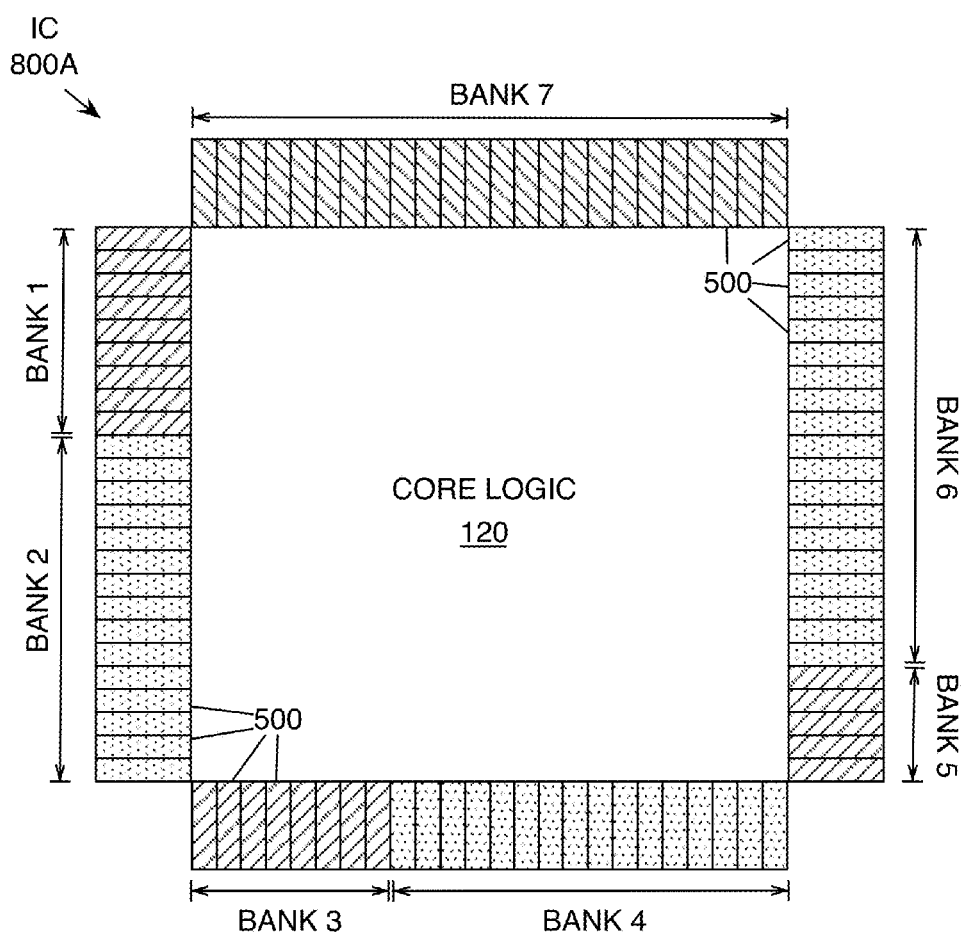
FIG. 6A is a plan view of an IC illustrating one mask-programmed I/O bank arrangement.
Figure 6B:
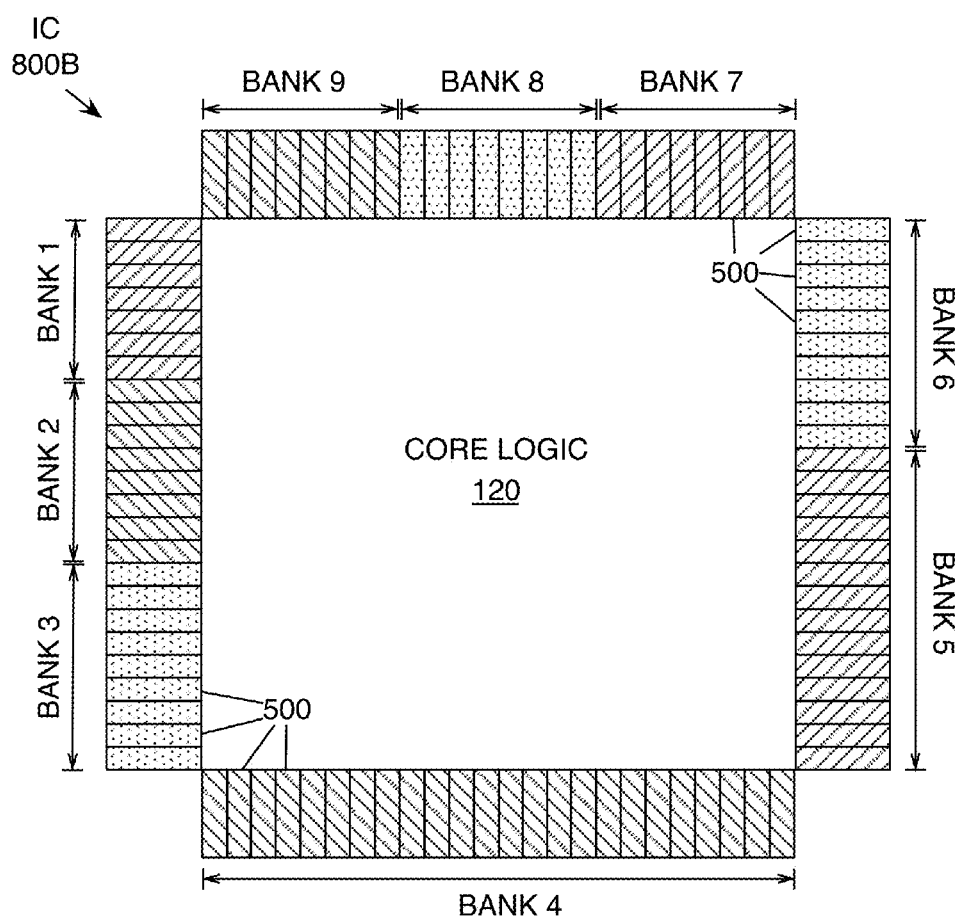
FIG. 6B is a plan view of an IC illustrating another mask-programmed I/O bank arrangement.

Referring to FIGS. 6A and 6B, FIG. 6A shows a top view of the entire layout of die 800A of an example IC, according to one embodiment. Similarly, FIG. 6B shows a top view of the entire layout of die 800B of a different example IC. In FIGS. 6A and 6B, each example die may use, for example, periphery cell 400 (FIG. 2). Periphery cell 400 includes six uncommitted pads, which may be used for I/O signals, as well as three power/ground pads. Uncommitted pads can be mask programmed for I/O signals. Alternatively, some (or even all) of those uncommitted pads can be mask programmed to help supply the power requirements of the die. Periphery cell 400 also may include three power/ground pads and six power/ground lines. Each power/ground pad can be independently mask programmed to connect to any of those six power/ground lines. Various other embodiments may use periphery cells of various designs, consistent with the principle described herein.

Each of the die 800A and 800B includes core logic 120. ICs 800A and 800B have quite different I/O bank architectures. (In the illustrated example, die 800A includes seven I/O banks of various numbers of I/Os, and die 800B includes nine I/O banks of various numbers of I/Os.) Each of these I/O architectures may be determined by late stage mask programming. Each of these I/O banks may be independent of the others with respect to the I/O standard(s) or power supply used within that bank. Typically, different I/O standards may have different or same power supply requirements, which may be flexibly supported as illustrated and described previously in relation to FIGS. 5A-5C. FIGS. 6A and 6B illustrate the advantageous IC design flexibility supported by this aspect of the mask programmability of the present embodiment.

Flexible I/O Pad Bonding Options

Pad bonding options may include wire bonding, flip-chip bonding, or other types of bonding. Significantly, the choice between wire bond packaging and flip-chip packaging can be made late in the IC design cycle, or even after the IC design is finalized.

Figure 7:
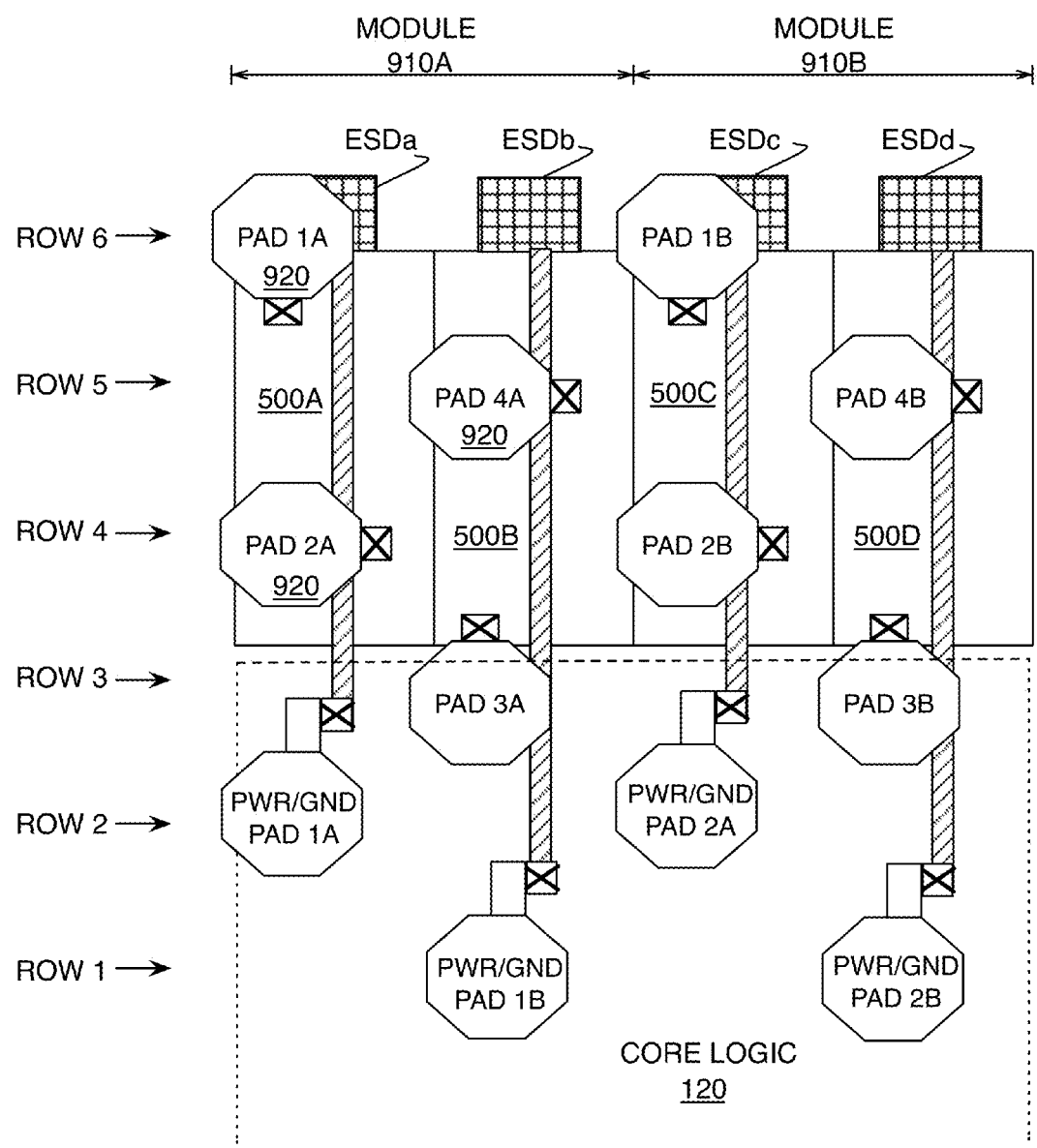
FIG. 7 is a diagram of I/O circuitry configured in accordance with a flip-chip mask programming option.

Referring to FIG. 7, a diagram is shown of I/O circuitry configured in accordance with a flip-chip pad option in which the pads are bump pads rather than wire bond pads. Instances of bump pads may overlie core logic—a substantial advantage of flip-chip packaging. Each periphery cell 500A, 500B, 500C and 500D includes a pair of I/O buffers like I/O buffers 440 and 450 (FIG. 3). While the buffer layout remains the same, the pad layout (defined by customization circuitry) may be different. Odd numbered periphery cells (500A, 500C) have associated with them three bond pads including two uncommitted bond pads in rows 6 and 4 and one power/ground bond pad in row 2. An ESD protection circuit (ESDa, ESDc) abuts the I/O buffers of the periphery cell (500A, 500C) and partly underlies the bond pad in row 6. Whereas the ESD protection circuit (ESDa, ESDc) may be centered on the periphery cell, the bond pad in row 6 may be centered on a left half of the periphery cell. The power/ground bond pad in row 2 may overlie a core logic area 120.

Even numbered periphery cells (500B, 500C) differ in that their bond pads may offset (staggered), being located in rows 1, 3 and 5. Odd and even-numbered periphery cells may be paired to form a larger module; i.e., periphery cells 500A and 500B may be paired to form a module 910A, and periphery cells 500C and 500D may be paired to form a module 910B.

Figure 8A:
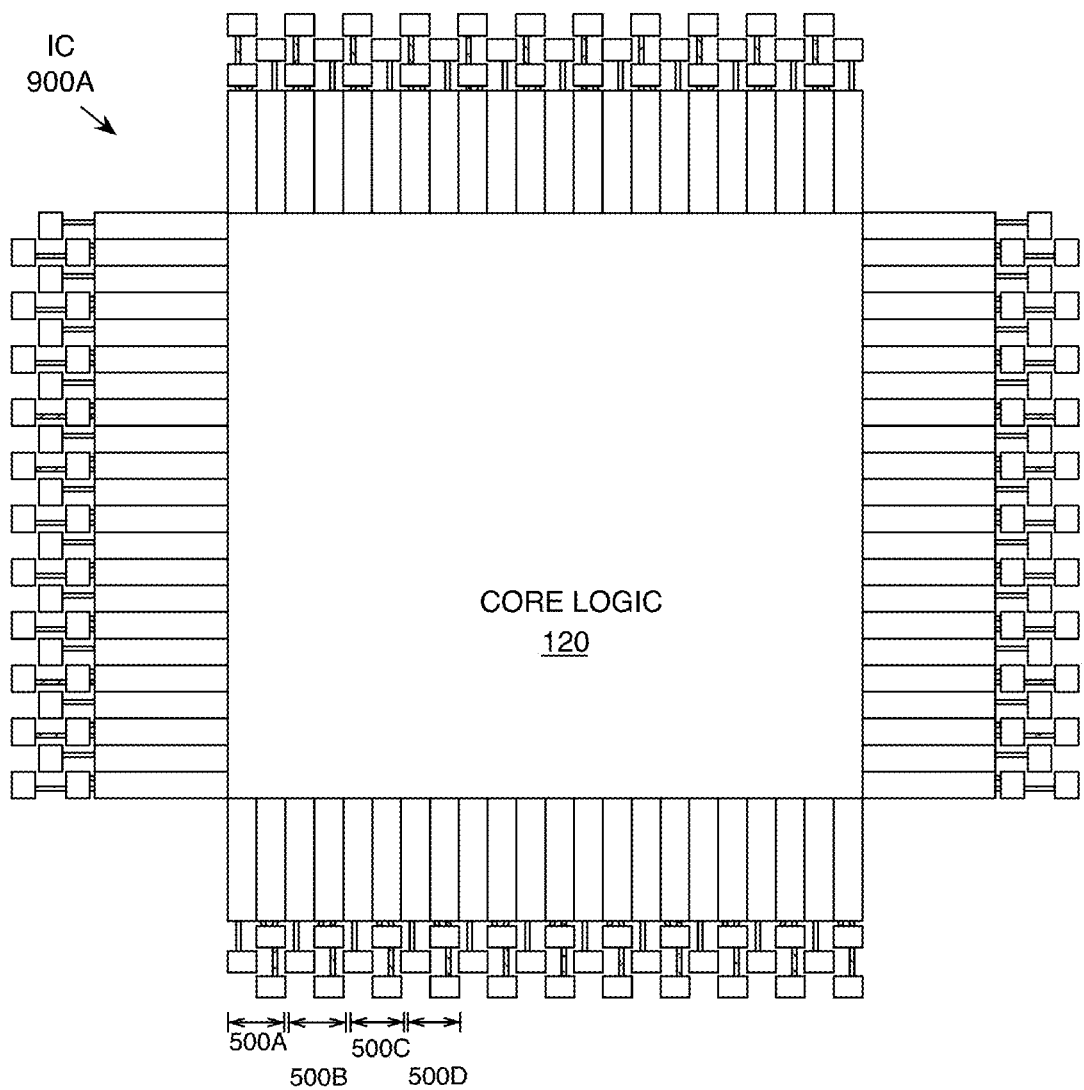
FIG. 8A is a diagram of an IC having I/O pads configured in accordance with a wire bonding mask programming option.
Figure 8B:
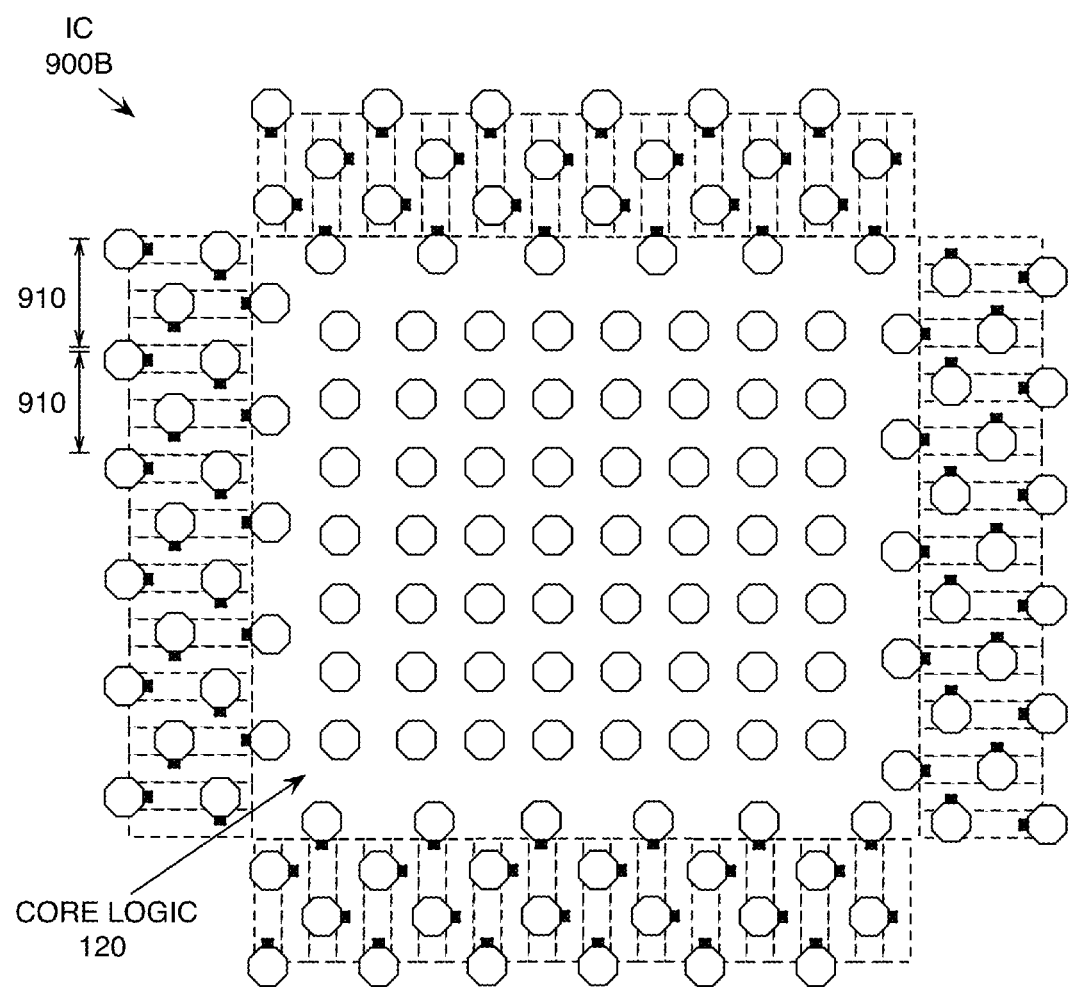
FIG. 8B is a diagram of an IC having I/O pads configured in accordance with a flip-chip bonding mask programming option.

Referring to FIGS. 8A and 8B, in FIG. 8A, a diagram is shown of a top view of the entire layout of a IC die 900A, according to one embodiment. Die 900A includes instances of periphery cell 500 along each of its four edges. In FIG. 8B, a diagram is shown of a top view of the entire layout of an IC die 900B, according to one embodiment. In FIG. 8A, periphery cells 500 are positioned to form a square, within which is positioned core logic 120. In FIG. 8B, periphery modules 910 are positioned to form a square, within which is positioned core logic 120.

Periphery cell 500, as used in die 900A, may contain three bond pads. Periphery module 910, as used in die 900B, may contain six bump pads such as bump pad 920 (FIG. 7). This alteration between periphery cell 500 and periphery module 910 may be a simple matter of mask programming. Typically the minimum distance separating adjacent bump pads will be larger than the minimum separation required between bond pads.

In the case of both wire bond packaging and flip-chip packaging, any particular bond/bump pad can go unused in a particular specific IC design. Similarly, any particular uncommitted bond/bump pad can be mask programmed to be either a signal bond/bump pad, or a power/ground bond/bump pad.

As described in relation to the foregoing embodiments, periphery cells may be mask programmable in various ways, including but not limited to the ways explicitly described herein and shown in the accompanying figures. For example, periphery cells can be masked programmed to specify, relatively late in the wafer fabrication process some or all of the following: the choice between including bump pads or bond pads in the IC dies when the later wafer processing steps are completed; which uncommitted bond pads, or uncommitted bump pads, may be used for input signals, which may be used for output signals, which may be used for bidirectional I/O signals, and which may be used for a power/ground line; which uncommitted bond pads, or uncommitted bump pads, may be used for input signals, which may be used for output signals, which may be used for bidirectional I/O signals, and which may be used for a power/ground line; and a wide variety of functional characteristics within the core logic of the IC.

Such late mask programming can be employed to advantageously reduce manufacturing turn around time (TAT) when changes are made in the design of an IC that may be implemented according to the described embodiments. This late mask programming can also advantageously reduce the cost incurred for each set of design changes, because only a few of the potentially many masks use to fabricate the IC need to be regenerated. These advantages can be realized whether such IC design changes are made to remove bugs or as a result of evolving product requirements.

Embodiments of the invention may take the form of methods of laying out the I/O portion of an integrated circuit, as well as non-transitory computer readable media containing instructions for accomplishing such layout. Various features of the present invention, including but not limited to periphery cells, mask programmable capabilities, and I/O banks can be represented in a variety of hardware description languages (HDLs). HDL descriptions may vary from low-level to high-level. A wide variety of HDLs are known in the art. A wide variety of computer systems are also known in the art. Using one or more HDLs, a design of an IC can be represented in a way that can be interpreted (i.e., processed, manipulated, compiled, synthesized, simulated, or transformed) by one or more computer systems.

Figure 9A:
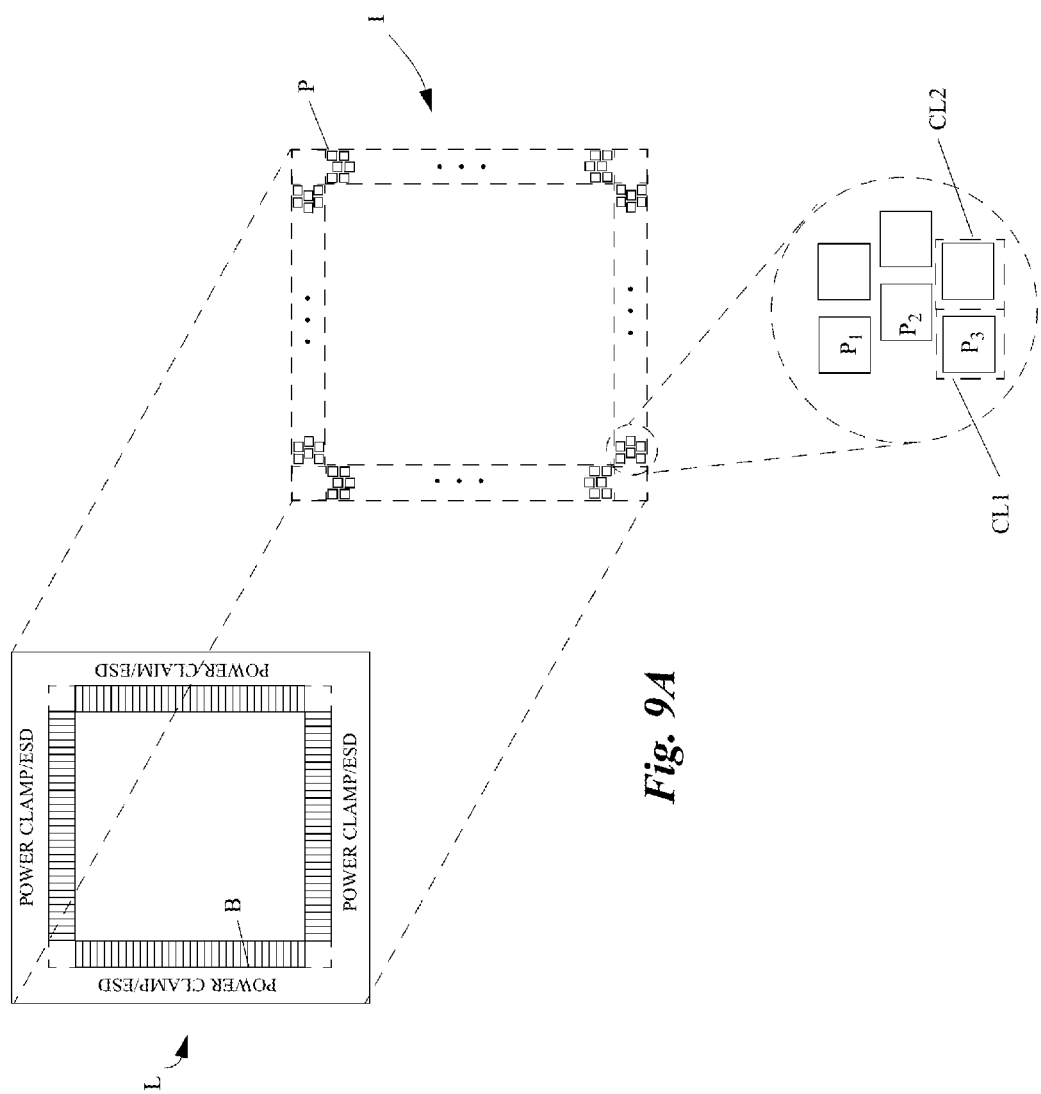
FIG. 9A is a diagram of an I/O arrangement.

Referring now to FIG. 9A, a plan view is shown of metal layers of an I/O arrangement in accordance with further exemplary embodiments. A layer L includes metallization for an I/O buffer ring in which I/O buffers B are arrayed in a line along each side of the integrated circuit. A layer L' includes a pad ring in which bond pads P are arrayed in groups along each side of the integrated circuit. In the illustrated arrangement, three bond pads are grouped together, the bond pads being staggered. In this arrangement, a group of three bonds pads P1, P2, and P3 are grouped in staggered fashion with the bond pad P3 overlying an power clamp/ESD circuit CL1 as shown in the partial exploded view of FIG. 9A. In a neighboring group of bond pads, one of the bond pads overlies a power clamp/ESD circuit CL2. The circuits CL1 and CL2 are part of a ring of power clamp/ESD circuitry provided outside an I/O buffer ring that includes a buffer circuit B. In the remainder of the present description, power clamp/ESD circuits will be referred to simply as power clamp circuits.

Figure 9B:
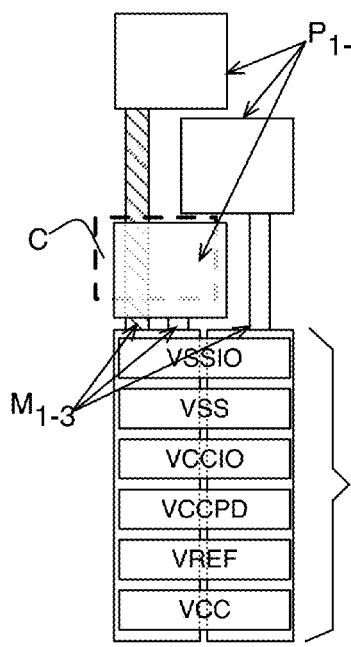
FIG. 9B is a diagram of an I/O arrangement allowing for flexible customization.

Referring to FIG. 9B, power bus or power strap segment segments 901 may be provided inwardly of the bond pads $P_{1-3}$. The power strap segment segments may include, for example, VSSIO, VSS, VCCIO and VCCPD. The bond pads $P_{1-3}$ are shown in an uncommitted or unprogrammed state. Pad route metal M1-3 is provided for programmably connecting each of the bond pads $P_{1-3}$ to a selected power strap segment 901 or to a selected I/O buffer to function as an I/O signal. A power clamp circuit C may be provided underneath one or more of the bond pads $P_{1-3}$. In this embodiment, a relatively large number of power clamp circuits is available. Each power clamp circuit may be metal programmable in order to configure it according to a particular voltage requirement.

In some instances, two of the three bond pads in a group may be programmed as signal pads. In this example, within a group of three bond pads, two may be connected to the I/O neighboring I/O buffers, while a third may be connected to power or ground.

Figure 9C:
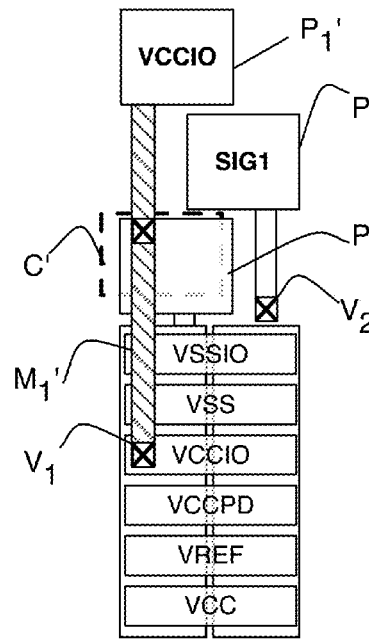
FIG. 9C is a diagram of one configuration of the I/O arrangement of FIG. 9A.
Figure 9D:
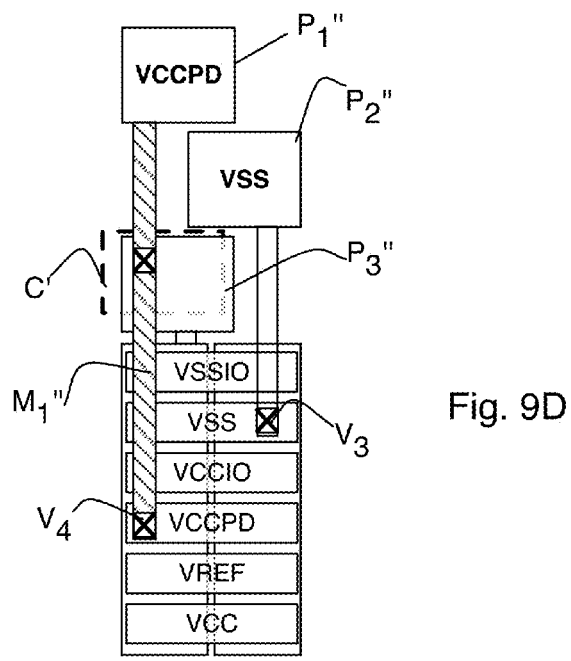
FIG. 9D is a diagram of another configuration of the I/O arrangement of FIG. 9A.

Different customizations of the I/O arrangement of FIG. 9B are shown in FIG. 9C and FIG. 9D. In FIG. 9C, a via $V_1$ is used to connect a bond pad $P'_1$ to the VCCIO power strap segment. A via $V_2$ is used to connect a bond pad $P'_2$ to an I/O buffer that has a signal SIG1 as an input or output. P3' may be connected to an I/O buffer that has a signal SIG2 as an input or output or may be connected to any power strap segment to provide additional power or ground. The clamp circuit C' is metal programmed to provide power protection for VCCIO/VSSIO.

In the example of FIG. 9D, a via $V_3$ is used to connect the bond pad $P''_2$ to the VSS power strap segment. A via $V_4$ is used to connect the bond pad $P''_1$ to the VCCPD power strap segment. The clamp circuit C'' is metal programmed to provide power protection for VCCPD/VSS.

Note that a pad may be connected directly to a power clamp circuit using a via, for example. Alternatively, a pad, along with other pads, may be connected to a power strap segment that is in turn connected to a power clamp circuit. In this manner, the power clamp circuit is shared by multiple pads that may be connected to one or more power strap segments that form a power bus.

Figure 10A:
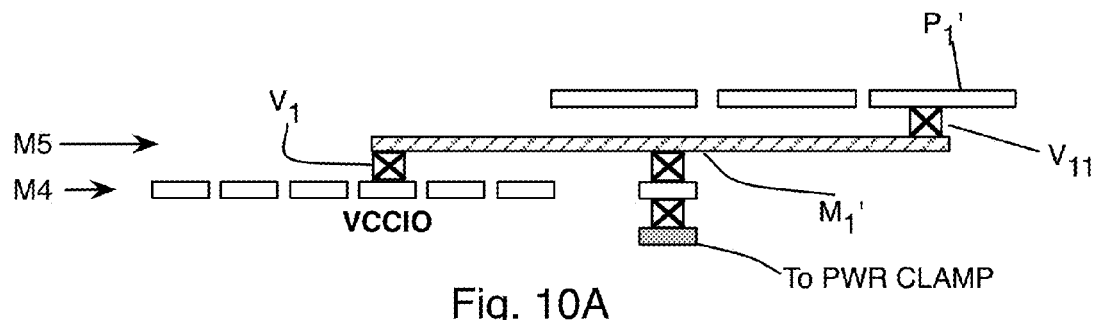
FIG. 10A is a cross-sectional view of a first portion of the I/O arrangement of FIG. 9B.
Figure 10B:
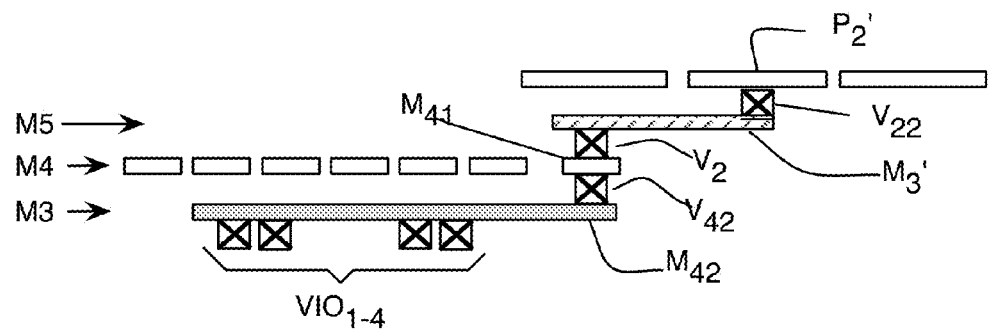
FIG. 10B is a cross-sectional view of a second portion of the I/O arrangement of FIG. 9B.
Figure 10C:
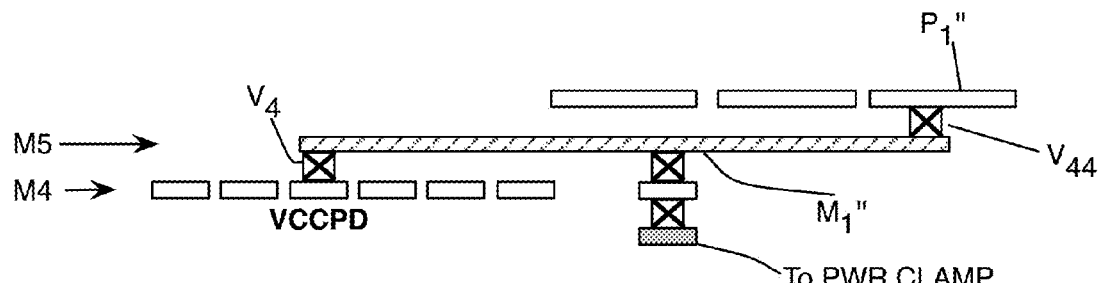
FIG. 10C is a cross-sectional view of a first portion of the I/O arrangement of FIG. 9C.
Figure 10D:
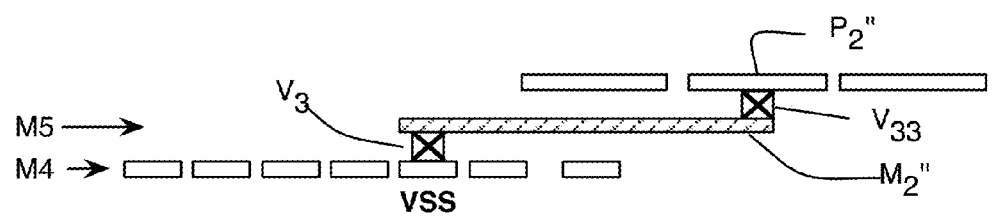
FIG. 10D is a cross-sectional view of a second portion of the I/O arrangement of FIG. 9C.

Particulars of how the bond pads are connected in the foregoing examples are shown in FIGS. 10A-10D. The two different programmed states of the bond pad $P_1$ are shown in FIG. 10A and FIG. 10C, respectively. In FIG. 10A, the bond pad $P_1'$ is connected by a via $V_{11}$ to a pad route metal trace $M_1'$, and by the via $V_1$ to the power strap segment VCCIO. In FIG. 10C, the bond pad $P_1''$ is connected by a via $V_{44}$ to a pad route metal trace $M_1''$, and by the via $V_4$ to the power strap segment VCCPD.

In the case of the bond pad $P_2$, in its first programmed state, as shown in FIG. 10B, it is connected by a via $V_{22}$ to a pad route metal trace $M_3'$, which is connected in turn to a metal trace $M_{41}$ and a metal trace $M_{42}$ by vias $V_2$ and $V_{42}$. The metal trace $M_{42}$ is connected to an I/O buffer by vias $VIO_{1-4}$. In its second programmed state, shown in FIG. 10D, the bond pad $P_2''$ is connected by a via $V_{33}$ to a pad route metal trace $M_2''$, and by the via $V_3$ to the power strap segment VSS.

Figure 9E:
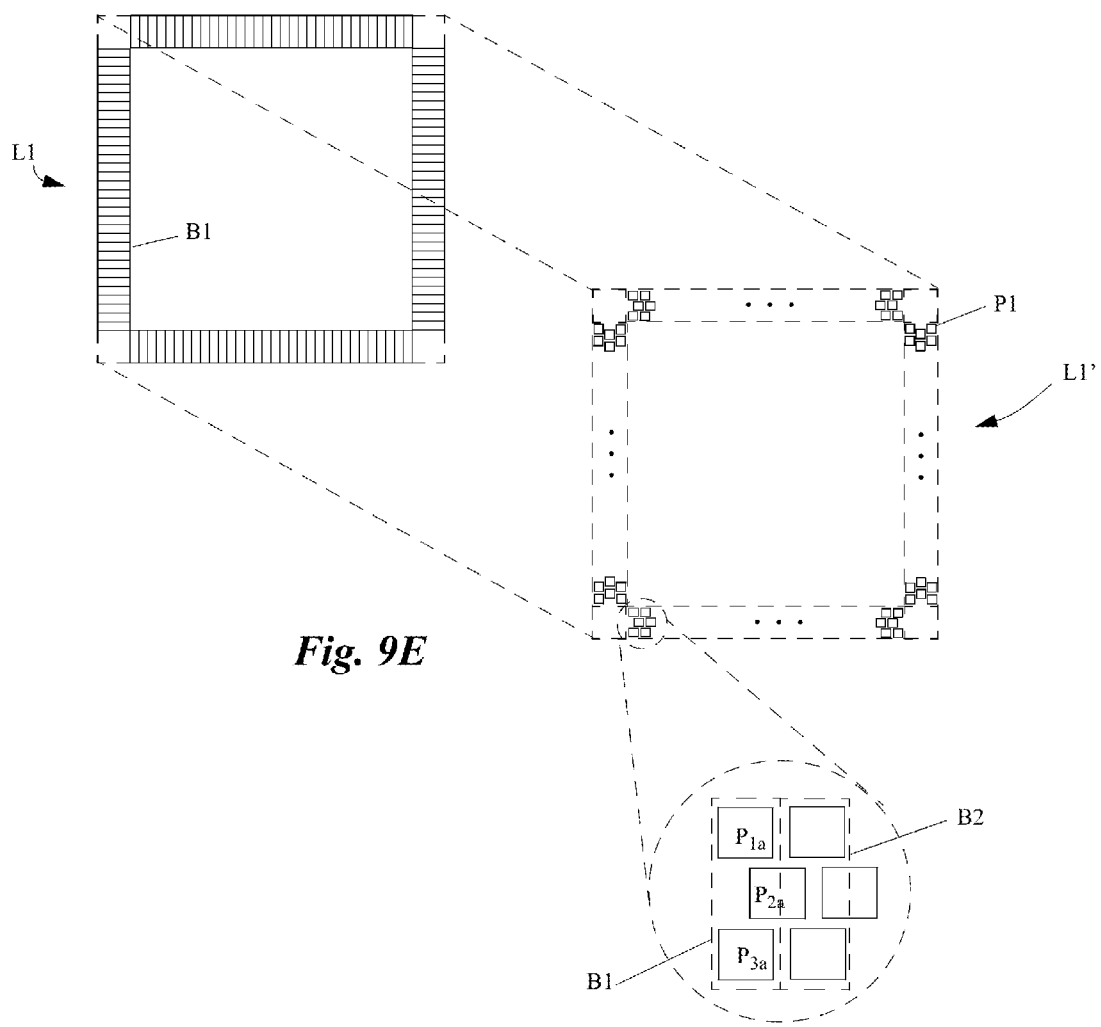
FIG. 9E is a diagram of another I/O arrangement.

Referring now to FIG. 9E, a plan view is shown of metal layers of an I/O arrangement in accordance with further exemplary embodiments. As compared to the embodiment of FIG. 9A, instead of instead of the pads overlying an ESD ring provided outside an I/O buffer ring, the pads overlie the I/O buffer ring itself, with ESD circuitry being provided as described below. A layer L1 includes metallization for an I/O buffer ring in which I/O buffers B are arrayed in a line along each side of the integrated circuit. A layer L1' includes a pad ring in which bond pads P1 are arrayed in a line along each side of the integrated circuit. In the illustrated arrangement, three bond pads overlie each adjacent pair of I/O buffers, the bond pads being staggered. In this arrangement, a group of three bonds pads P1a, P2a, and P3a overlie a pair of I/O buffers B1a and B2a in staggered fashion as shown in the partial exploded view of FIG. 9E. In one exemplary embodiment, the I/O pads may be provided in a metal layer M6, while I/O driver metallization may be provided in a metal layer M2. In this embodiment the bond pads may be directly on top of I/O macros, unlike FIG. 9A in which bond pads are placed outside of I/O macros that define the I/O buffers B.

Figure 11A:
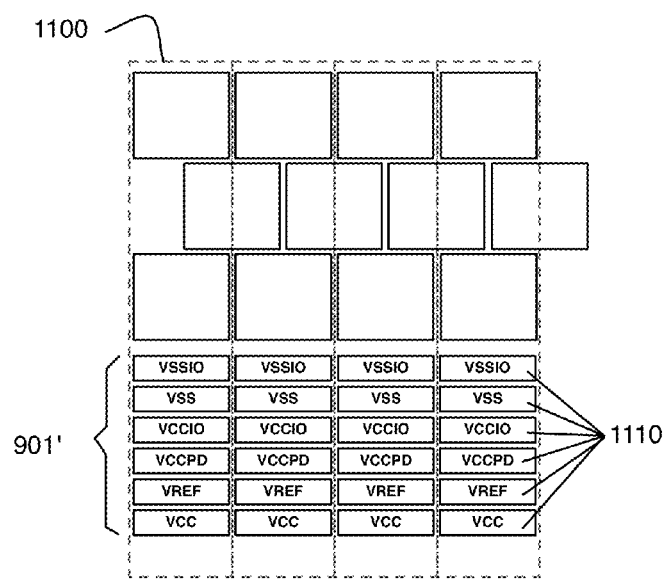
FIG. 11A is a diagram of an I/O arrangement customized in accordance with a first customization.

The bond pads and the power strap segments may be combined in the form of an I/O macro instances of which may be tiled together to form an I/O arrangement. A group of instances of such an I/O macro 1100 is shown in FIG. 11A. Each such I/O macro includes uncommitted or unconnected power strap segment or reference voltage segments 1110. Tiled together, those segments may form a power/ground/reference-voltage ring 901'. Two of the three bond pads may be contained entirely within the I/O macro. The middle bond pad may be split between I/O macros to achieve a staggered pad layout. That is, the middle bond pad may be formed by tiling together two adjacent I/O macros.

Figure 11B:
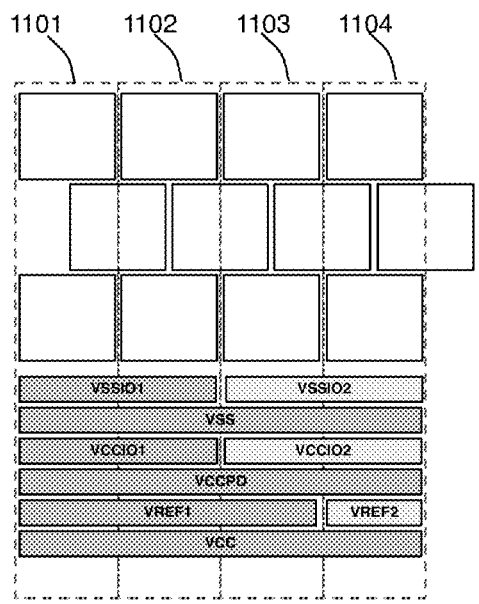
FIG. 11B is a diagram of an I/O arrangement like that of FIG. 11A customized in accordance with a second customization.
Figure 11C:
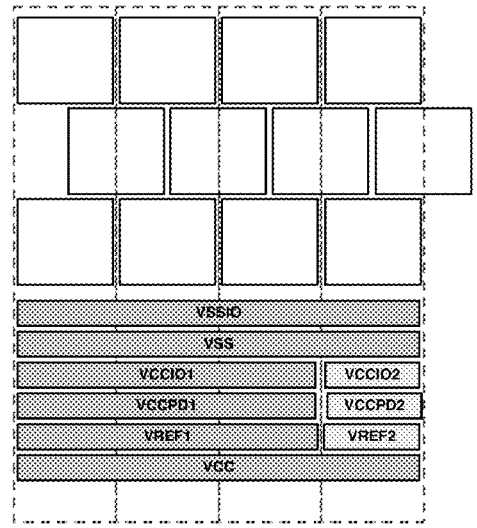
FIG. 11C is a diagram of an I/O arrangement like that of FIG. 11A customized in accordance with a third customization.

Note that the power strap segment segments and the voltages carried thereby may vary along the length of the power/ground/reference voltage ring depending on I/O bank requirements of a design. Hence, in one programmed state of the I/O arrangement of FIG. 11A, shown in FIG. 11B, the voltage straps VSS, VCCPD and VCC may be continuous across I/O macros 1101-1104. In the case of the remaining power/ground/reference voltages, there may be different voltages VSSIO1 and VCCIO1 (spanning the I/O macros 1101 and 1102) and VSSIO2 and VCCIO2 (spanning the I/O macros 1103 and 1104). A voltage VREF1 spans I/O macros 1101-1103, and a voltage reference VREF2 spans the I/O macro 1104. In a different programmed state, as shown in FIG. 11C, the voltage straps VSSIO, VSS, and VCC are continuous. Different voltages VCCIO1, VCCPD1 and VREF1 span the I/O macros 1101-1103, and VCCIO2, VCCPD2 and VREF2 span the I/O macro 1104.

The I/O macro 1100 results in the capability of flexible "power banking," as previously described in relation to FIG. 6A and FIG. 6B. Different variations of I/O macros may also be used to accommodate different bonding arrangements (pad bonding, bump bonding, etc.) as previously described in relation to FIG. 7 and FIGS. 8A and 8B.

In a complex SoC system design, simultaneous switching noise (SSN) often leads to the degradation of signal integrity by causing signal distortion, thereby reducing noise margin of a system. Decoupling capacitors may be used to mitigate potential SSN issues. In metal programmable I/O system, the determination of the amount of decoupling capacitors needed for different SoC designs is difficult since the I/O standards and/or interface used in an SoC design are not known in advance. One embodiment of the invention provides a method to implement flexible and metal programmable power bank and decoupling capacitance arrangements to mitigate SSN issues.

Figure 12:
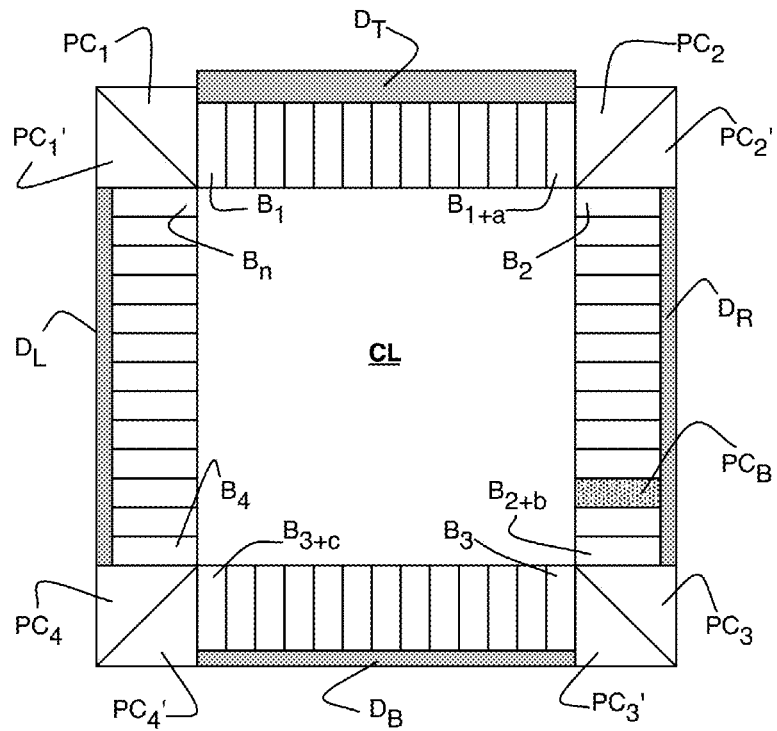
FIG. 12 is a plan diagram of an integrated circuit showing details of power clamp and decap features.

Referring to FIG. 12, a diagram is shown of an integrated circuit showing details of power clamp and decap (decoupling capacitor) features. A core logic region CL is surrounded by ranks of I/O slots $B_1$ to $B_{1+a}$, $B_2$ to $B_{2+b}$, etc. One or more of the I/O slots may be replaced by a power clamp circuit that may occupies the same area, as in the case of a power clamp circuit $PC_B$, for example. Outside each rank of buffers is provided a decap area in which decoupling circuitry such as decoupling capacitors may be formed, the decap areas including top, bottom, left and right decap areas $D_T$, $D_B$, $D_L$, $D_R$. Different ones of the different decap areas may have different widths, depending on the I/O application different amount of decap can be provided by metal only programming. Placing the decoupling circuitry at the edge of the die or outer part of I/O slot provides a method of providing different widths or amount of decoupling capacitors without affecting the floorplan or placement of I/Os and core logic. In the example of FIG. 12, the decap area $D_T$ has been made wider to minimize simultaneous switching noise without significantly altering arrangement or placements of I/Os and the core logic region CL.

Embodiments of the invention provide for power clamp arrangements and placement to provide customizable and flexible metal programmable power banks while meeting ESD requirements. In the example of FIG. 12, two power clamp circuits are provided at each corner area, including power clamp circuits $PC_1$, $PC_1'$, $PC_2$, $PC_2'$ $PC_3'$, $PC_3'$, $PC_4'$, $PC_4'$. The power clamp circuit can also be arranged to occupy an I/O slot area shown as $PC_B$. The power clamp circuits may be metal programmable according to different power supply voltages and I/O standards used in the bank of I/Os. In this embodiment, the number of power clamp circuits that is available is smaller than in embodiments previously described. The power clamp circuits may be made flexible, for example, by including different sub-circuits for different voltage requirements, with metal programming being used to select the appropriate sub-circuit.

Figure 13A:
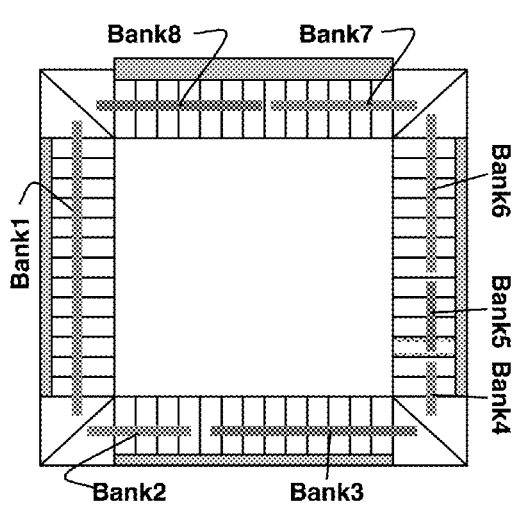
FIG. 13A is a plan diagram of an integrated circuit customized in accordance with a first customization using features of the I/O arrangements of FIGS. 9-12.
Figure 13B:
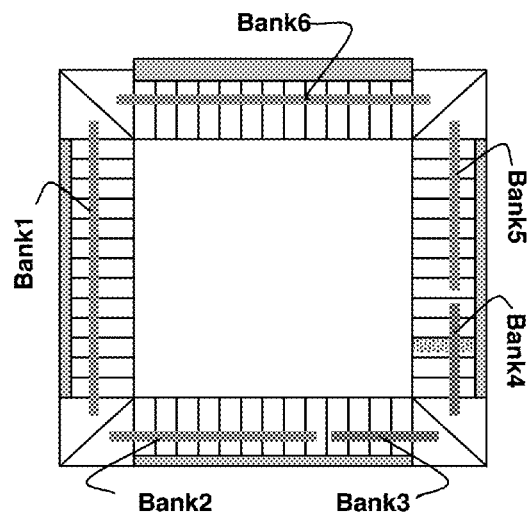
FIG. 13B is a plan diagram of an integrated circuit customized in accordance with a second customization using features of the I/O arrangements of FIGS. 9-12.

The foregoing arrangement supports flexible power banking, as illustrated in FIG. 13A and FIG. 13B. Each power bank includes one or more power clamps, at one corner (FIG. 13A, bank 2), at two corners (FIG. 13A, bank 1), within an I/O slot (FIG. 13A, bank 5), or both at a corner and within an I/O slot (FIG. 13B, bank 4).

In FIG. 13A and FIG. 13B, lines representing power banks should be understood as representing a multiplicity of lines corresponding to the number of power strap segments. Taking the I/O macro of FIG. 11A, which has six power strap segments, as an example, the lines representing power banks in FIG. 13A and FIG. 13B would represent six separate lines. As illustrated in FIG. 11B and FIG. 11C, for a typical power bank, power strap segments corresponding to one or more of those lines would be joined together by metal programming to form a continuous power bus for the length of that power bank. In other instances, power strap segments corresponding one or more others of those lines will not form a continuous power bus for the length of that power bank, but instead will define multiple separate power buses.

Figure 14:
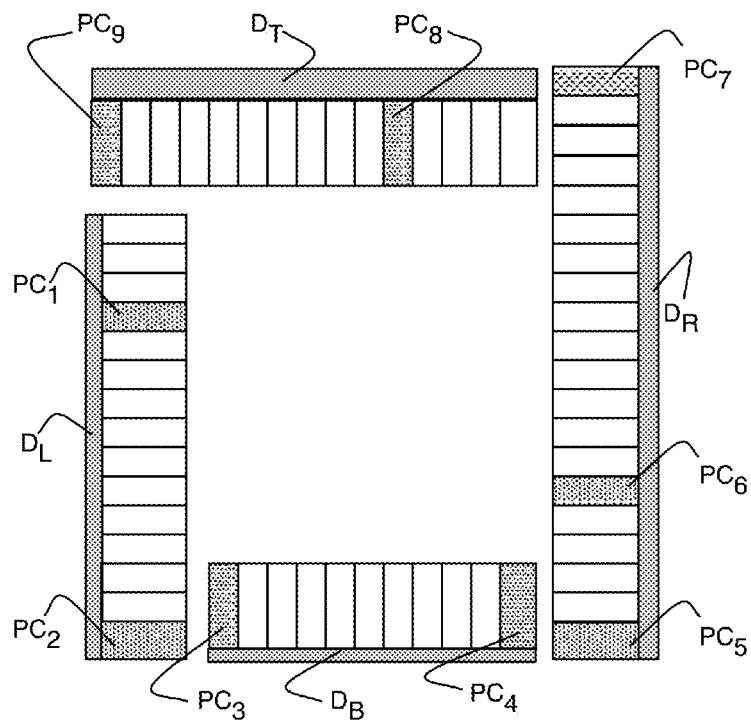
FIG. 14 is a plan diagram of an integrated circuit showing details of power clamp and decap features in accordance with another embodiment.
Figure 14A:
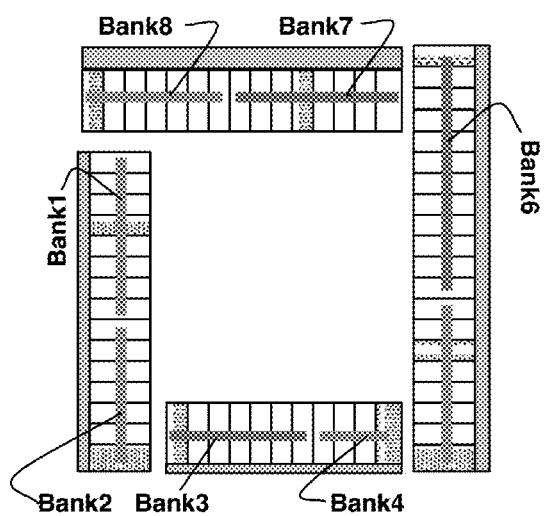
FIG. 14A is a plan diagram of an integrated circuit customized in accordance with a first customization using features of the I/O arrangements of FIGS. 9-11 and 14.
Figure 14B:
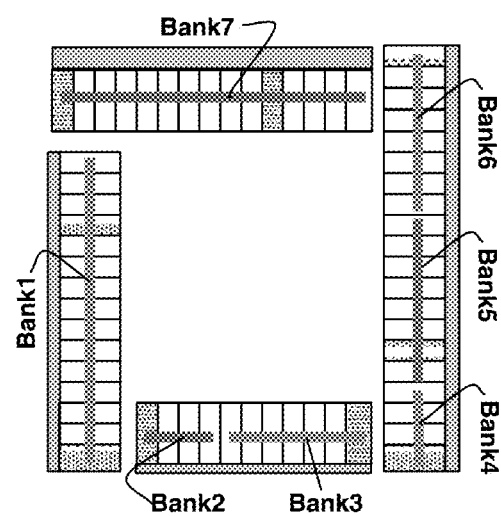
FIG. 14B is a plan diagram of an integrated circuit customized in accordance with a second customization using features of the I/O arrangements of FIGS. 9-11 and 14.

Various other ways of situating power clamp circuitry may be used, one of which is illustrated in FIG. 14. In FIG. 14, the corner regions of FIG. 12 are eliminated and are occupied instead by I/O slots. Power clamp circuits $PC_1$-$PC_9$ are provided in selected ones of the I/O slots. Scalable decap areas $D_T$, $D_B$, $D_L$, $D_R$ are provided in like manner as in FIG. 12. That is, decoupling circuitry is arranged along outer edges (edges furthest removed from the core logic region) of the ranks of I/O slots. In the illustrated embodiment, four ranks of I/O slots are arranged around a square core logic portion such that for each of the ranks of I/O slots, an end portion of the rank of I/O slots is overlapped by a side portion of a neighboring rank of I/O slots. Such an arrangement supports various different power banking arrangements as shown, for example, in FIG. 14A and FIG. 14B. The I/O slots corresponding to the different power banks are connected to one or more power clamp circuits occupying selected I/O slots and metal programmed in accordance with the power requirements of the different power banks As used herein, words of approximation, unless otherwise defined, are used to mean plus or minus ten percent of nominal value.

It will be apparent to those of ordinary skill in the art that the present invention can be embodied in other specific forms without departing from the spirit or essential character thereof. The foregoing description is therefore to be regarded as illustrative, not restrictive. The scope of the invention is defined by the appended claims, not the foregoing description, and all changes which some within the range of scope of equivalents thereof are intended to be embraced therein.

What is claimed is:

1. A metal programmable integrated circuit comprising a core logic region and a surrounding I/O region, the I/O region comprising tiled cells defining:
   a plurality of ranks of I/O slots surrounding the core logic region;
   a plurality of power strap segment segments surrounding the core logic region;
   multiple tiers of pads surrounding the core logic region and grouped into groups of pads, pads of different tiers being staggered relative to pads of at least one other tier, wherein for each of a plurality of the groups of pads, the group of pads is positioned adjacent to or above a group of I/O slots having a fewer number of I/O slots than a number of pads in the group of pads, and the group of pads has a width not greater than a width of the group of I/O slots;
   a plurality of power clamp circuits; and
   one or more programmable metal layers coupling each of the power clamp circuits to one of the power strap segment segments and to at least one of the pads;
   wherein the one or more programmable metal layers determine at least one of: pad definitions of a plurality of pads as between at least signal pads, power pads of a first voltage, power pads of a second voltage, and ground pads; and power bank definitions of a plurality of power banks, each power bank having a span that spans a range of pads, wherein for each power bank at least one of said power strap segment segments is continuous across a span of that power bank; and
   wherein for each I/O slot of the plurality of ranks of I/O slots, each of the plurality of power strap segment segments, and each of the pads of the plurality of groups of pads, different I/O slots are defined by identical cells, different power strap segment segments are defined by identical cells, and different pads are defined by identical cells.

2. The apparatus of claim 1, wherein the one or more programmable metal layers determine both: pad definitions of a plurality of pads as between at least signal pads, power pads of a first voltage, power pads of a second voltage, and ground pads; and power bank definitions of a plurality of power banks, each power bank having a span that spans a range of pads, wherein for each power bank comprises at least one power strap segment comprising one or more power strap segment segments that is continuous across a span of that power bank.

3. The apparatus of claim 1, wherein different ones of the different power strap segment segments defined by identical cells are differentiated by the one or more programmable metal layers, and different ones of the different pads defined by identical cells are differentiated by the one or more programmable metal layers.

4. The apparatus of claim 1, wherein the group of pads is adjacent to the group of I/O slots.

5. The apparatus of claim 4, wherein at least some of the plurality of power clamp circuits are positioned underneath respective pads.

6. The apparatus of claim 5, wherein each of the plurality of power clamp circuits is metal programmable to allow for coupling to any of a ground pad, a power pad of a first voltage, and a power pad of a second different voltage.

7. The apparatus of claim 4, wherein the one or more programmable metal layers define a plurality of power banks each having a span that spans a different range of pads, wherein for each power bank: the range of pads for the power bank comprises a plurality of power or ground pads each of which is designated for connection to the same power or ground voltage, and each of which is coupled to a power clamp circuit programmed for that power or ground voltage.

8. The apparatus of claim 7, wherein a plurality of power or ground pads designated for connection to the same power or ground voltage is coupled to one of the plurality of power strap segment segments.

9. The apparatus of claim 8, wherein the one of the plurality of power strap segment segments is continuous for the range of pads belonging to that power bank.

10. The apparatus of claim 4, wherein, within a group of pads of the plurality of groups of pads, depending on the one or more programmable metal layers, a first number of pads up to the fewer number of I/O slots are defined as signal pads, and a remaining number of pads equal to a difference between the number of pads in the group of pads and the first number of pads are defined as power or ground pads according to programming of respective power clamp circuits to which respective ones of the remaining number of pads are coupled.

11. The apparatus of claim 1, wherein the group of pads is above the group of I/O slots.

12. The apparatus of claim 11, wherein at least some of the plurality of power clamp circuits are positioned within respective I/O slots in lieu of I/O circuitry.

13. The apparatus of claim 12, wherein each of the plurality of power clamp circuits comprises a plurality of sub-circuits including a sub-circuit for coupling to a ground pad, a sub-circuit for coupling to a power pad of a first voltage, and a sub-circuit for coupling to a power pad of a second different voltage.

14. The apparatus of claim 11, wherein at least some of the plurality of power clamp circuits are positioned within corner regions of the integrated circuit.

15. The apparatus of claim 14, wherein each of the plurality of power clamp circuits comprises a plurality of sub-circuits including a sub-circuit for coupling to a ground pad, a sub-circuit for coupling to a power pad of a first voltage, and a sub-circuit for coupling to a power pad of a second different voltage.

16. The apparatus of claim 11, wherein the one or more programmable metal layers define a plurality of power banks each having a span that spans a different range of pads, wherein for each power bank: the range of pads for the power bank comprises a plurality of power or ground pads each of which is designated for connection to the same power or ground voltage, and each of which is coupled to a power clamp sub-circuit corresponding to that power or ground voltage.

17. The apparatus of claim 16, wherein a plurality of power or ground pads designated for connection to the same power or ground voltage is coupled to one of the plurality of power strap segment segments.

18. The apparatus of claim 17, wherein the one of the plurality of power strap segment segments is continuous for the range of pads belonging to that power bank.

19. The apparatus of claim 11, wherein, within a group of pads of the plurality of groups of pads, depending on the one or more programmable metal layers, a first number of pads up to the fewer number of I/O slots are defined as signal pads, and a remaining number of pads equal to a difference between the number of pads in the group of pads and the first number of pads are defined as power or ground pads according to respective power clamp sub-circuits to which respective ones of the remaining number of pads are coupled.

20. The apparatus of claim 11, comprising, at a first outer edge of the integrated circuit, a first decoupling circuit, and at a second outer edge of the integrated circuit, a second decoupling circuit, wherein the first decoupling circuit and the second decoupling circuit are of different widths and have different decoupling capacities.

21. A metal programmable integrated circuit comprising a core logic region and a surrounding I/O region, the I/O region comprising tiled cells defining:
  a plurality of ranks of I/O slots surrounding the core logic region;
  a plurality of power strap segment segments surrounding the core logic region;
  multiple tiers of pads surrounding the core logic region and grouped into groups of pads, pads of different tiers being staggered relative to pads of at least one other tier, wherein for each of a plurality of the groups of pads, the group of pads is positioned adjacent to or above a group of I/O slots having a fewer number of I/O slots than a number of pads in the group of pads, and the group of pads has a width not greater than a width of the group of I/O slots;
  a plurality of power clamp circuits; and
  one or more programmable metal layers coupling each of the power clamp circuits to one of the power strap segment segments and to at least one of the pads;
  wherein the one or more programmable metal layers determine at least one of: pad definitions of a plurality of pads as between at least signal pads, power pads of a first voltage, power pads of a second voltage, and ground pads; and power bank definitions of a plurality of power banks, each power bank having a span that spans a range of pads, wherein for each power bank at least one of said power strap segment segments is continuous across a span of that power bank.

* * * * *